United States Patent
Isogai et al.

(10) Patent No.: US 8,476,149 B2
(45) Date of Patent: Jul. 2, 2013

(54) METHOD OF MANUFACTURING SINGLE CRYSTAL SILICON WAFER FROM INGOT GROWN BY CZOCHARLSKI PROCESS WITH RAPID HEATING/COOLING PROCESS

(75) Inventors: Hiromichi Isogai, Niigata (JP); Takeshi Senda, Niigata (JP); Eiji Toyoda, Niigata (JP); Kumiko Murayama, Niigata (JP); Koji Izunome, Niigata (JP); Susumu Maeda, Hadano (JP); Kazuhiko Kashima, Hadano (JP); Koji Araki, Niigata (JP); Tatsuhiko Aoki, Niigata (JP); Haruo Sudo, Niigata (JP); Yoichiro Mochizuki, Niigata (JP); Akihiko Kobayashi, Niigata (JP); Senlin Fu, Niigata (JP)

(73) Assignee: Global Wafers Japan Co., Ltd., Nigata (JP)

( * ) Notice: Subject to any disclaimer, the term of this patent is extended or adjusted under 35 U.S.C. 154(b) by 176 days.

(21) Appl. No.: 12/512,492

(22) Filed: Jul. 30, 2009

(65) Prior Publication Data

US 2010/0038757 A1 Feb. 18, 2010

(30) Foreign Application Priority Data

| Jul. 31, 2008 | (JP) | 2008-198680 |
| Jul. 31, 2008 | (JP) | 2008-198681 |
| Feb. 26, 2009 | (JP) | 2009-044379 |
| Mar. 9, 2009 | (JP) | 2009-054703 |

(51) Int. Cl.
*H01L 29/36* (2006.01)

(52) U.S. Cl.
USPC .................. 438/471; 257/E21.318

(58) Field of Classification Search
USPC ........... 438/795, 471; 257/E21.318, E21.328, 257/E29.109
See application file for complete search history.

(56) References Cited

U.S. PATENT DOCUMENTS

| 5,954,873 A | 9/1999 | Hourai et al. |
| 5,994,761 A | 11/1999 | Falster et al. |
| 6,143,071 A | 11/2000 | Aihara et al. |
| 6,180,220 B1 | 1/2001 | Falster et al. |
| 6,204,152 B1 | 3/2001 | Falster et al. |
| 6,579,779 B1 * | 6/2003 | Falster .......................... 438/471 |
| 6,803,331 B2 | 10/2004 | Hölzl et al. |
| 6,955,718 B2 | 10/2005 | Falster et al. |
| 7,344,689 B2 | 3/2008 | Umeno et al. |
| 7,846,252 B2 | 12/2010 | Umeno et al. |

(Continued)

FOREIGN PATENT DOCUMENTS

| CN | 1881547 A | 12/2006 |
| JP | 5-291097 A | 11/1993 |

(Continued)

*Primary Examiner* — Victor A Mandala
*Assistant Examiner* — Selim Ahmed
(74) *Attorney, Agent, or Firm* — Foley & Lardner LLP

(57) ABSTRACT

A silicon wafer produced from a silicon single crystal ingot grown by Czochralski process is subjected to rapid heating/cooling thermal process at a maximum temperature ($T_1$) of 1300° C. or more, but less than 1380° C. in an oxidizing gas atmosphere having an oxygen partial pressure of 20% or more, but less than 100%. The silicon wafer according to the invention has, in a defect-free region (DZ layer) including at least a device active region of the silicon wafer, a high oxygen concentration region having a concentration of oxygen solid solution of $0.7 \times 10^{18}$ atoms/cm³ or more and at the same time, the defect-free region contains interstitial silicon in supersaturated state.

10 Claims, 20 Drawing Sheets

U.S. PATENT DOCUMENTS

| | | |
|---|---|---|
| 2003/0068890 A1* | 4/2003 | Park ............................... 438/689 |
| 2005/0054124 A1* | 3/2005 | Mun et al. ........................ 438/12 |
| 2005/0081778 A1* | 4/2005 | Ando et al. ...................... 117/13 |
| 2005/0160967 A1* | 7/2005 | Falster et al. .................... 117/13 |
| 2006/0189169 A1 | 8/2006 | Adachi et al. |

FOREIGN PATENT DOCUMENTS

| | | |
|---|---|---|
| JP | 8-330316 A | 12/1996 |
| JP | 2000-031150 A | 1/2000 |
| JP | 2001-509319 A | 7/2001 |
| JP | 2002-134513 A | 5/2002 |
| JP | 2002-231726 A | 8/2002 |
| JP | 2003-224130 A | 8/2003 |
| JP | 2003-297840 A | 10/2003 |
| JP | 2005-522879 A | 7/2005 |
| JP | 2006-188423 A | 7/2006 |
| JP | 2006-261632 A | 9/2006 |
| JP | 2007-534579 | 11/2007 |
| WO | WO 03/088346 A1 | 10/2003 |

* cited by examiner

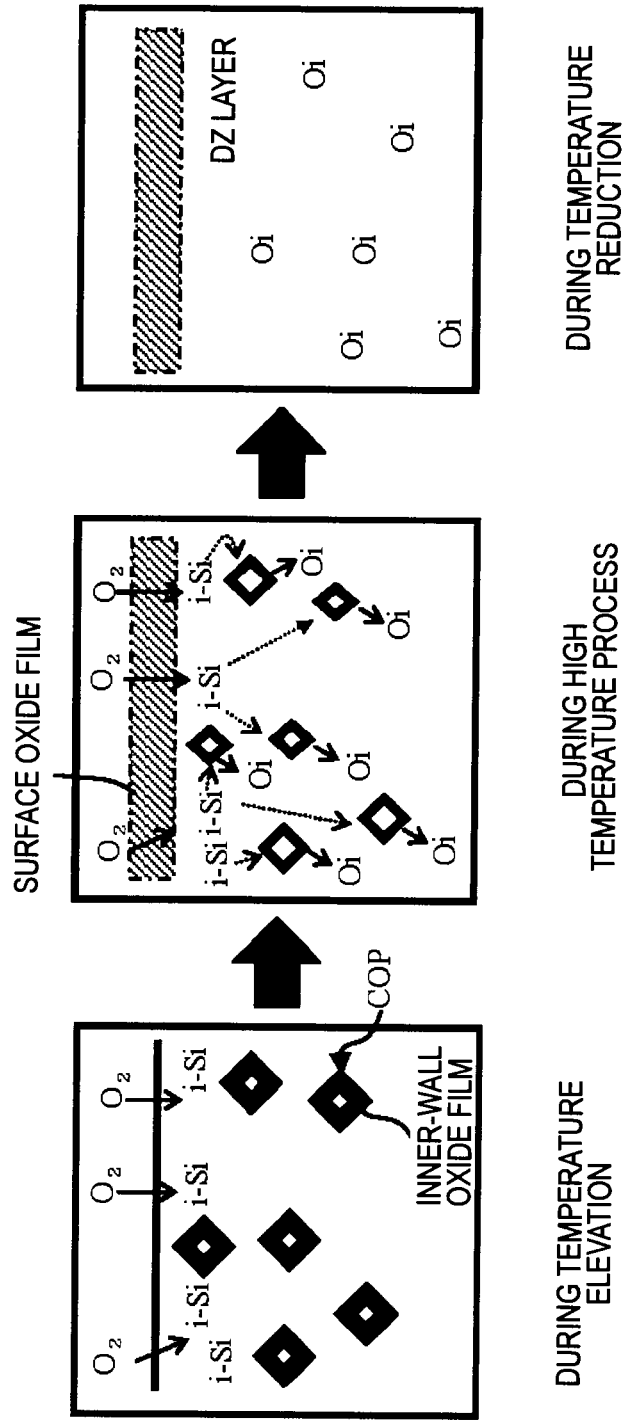

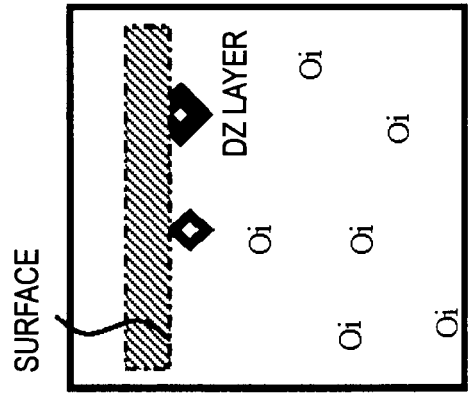
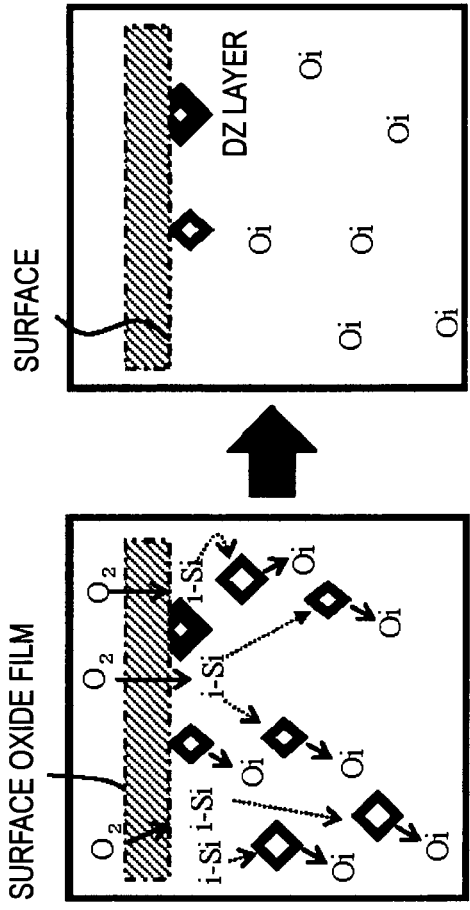
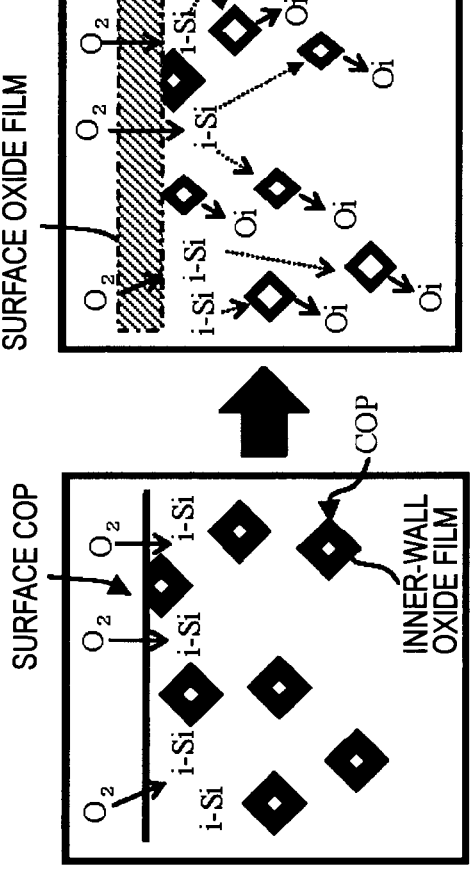

THE NUMBER IN THE DIAGRAM IS A DISTANCE (mm)
FROM CENTER MEASURED AT 9 POINTS

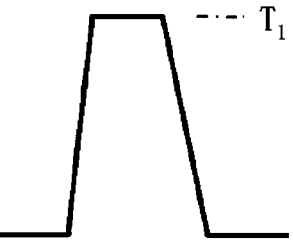
FIG. 10A
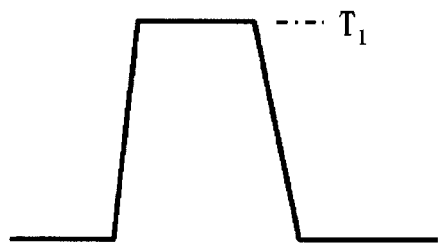
FIG. 10B
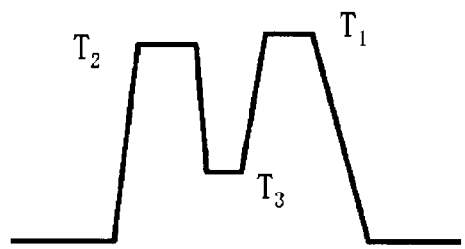
FIG. 10C

DURING TEMPERATURE ELEVATION

DURING HIGH TEMPERATURE PROCESS

DURING TEMPERATURE REDUCTION

DURING TEMPERATURE ELEVATION

DURING HIGH TEMPERATURE PROCESS

DURING TEMPERATURE REDUCTION

METHOD OF MANUFACTURING SINGLE CRYSTAL SILICON WAFER FROM INGOT GROWN BY CZOCHARLSKI PROCESS WITH RAPID HEATING/COOLING PROCESS

This application claims priority from Japanese Patent Application No. 2008-198680, filed on Jul. 31, 2008, Japanese Patent Application No. 2008-198681, filed on Jul. 31, 2008, Japanese Patent Application No. 2009-044379, filed on Feb. 26, 2009, and Japanese Patent Application No. 2009-054703, filed on Mar. 9, 2009, the entire contents of which are hereby incorporated by reference.

FIELD OF THE INVENTION

The present disclosure relates to a silicon wafer and a method for manufacturing the silicon wafer to be used as a substrate of semiconductor devices.

In addition, the present disclosure relates to a method for heat-treating the silicon wafer. The method is performed in order to apply the silicon wafer obtained by slicing a silicon single crystal ingot by a Czochralski process to semiconductor device.

DESCRIPTION OF RELATED ART

With trends toward high integration of semiconductor devices in recent years, requirement for the quality of a silicon wafer to be used as a substrate of such semiconductor devices is becoming severer. In particular, there is an eager demand for the development of a silicon wafer having less grown-in defects in the device active region thereof and a high gettering effect.

Grown-in defects include, for example, agglomerates of supersaturated vacancy-type point defects which are called Crystal Originated Particle (COP) or Laser Scattering Tomography Defect (LSTD), oxygen precipitates such as Oxidation Induced Stacking Fault (OSF) nuclei and Bulk Micro Defect (BMD) nuclei which will grow into OSF and BMD, and agglomerates of supersaturated interstitial silicon-type point defects which are called "dislocation clusters".

Of these grown-in defects, generation of agglomerates (dislocation clusters) of interstitial silicon-type point defects can be prevented by adjusting pull-up conditions upon pulling up single crystals, but it is very difficult to prevent generation of the agglomerates of vacancy-type point defects or the oxide precipitates.

When the oxide precipitates exist in a bulk region other than the device active region, they are useful because they have a gettering effect of noble metals. When the oxide precipitates exist in the device active region, on the other hand, they are not preferred because they may be a cause for reducing a device yield.

Various technologies are disclosed as a method for reducing such grown-in defects.

For example, there is disclosed a technique for producing a silicon single-crystal wafer having no grown-in defects across the surface thereof by controlling pulling conditions (pull rate V and temperature gradient G in crystal) when a silicon single crystal is grown by the Czochralski (CZ) process (for example, Patent Document 1).

There is also disclosed a technique for obtaining an epitaxial wafer having excellent crystallinity and Internal Gettering (IG) capacity by forming an epitaxial layer on the surface of a silicon wafer produced from a CZ silicon single crystal grown while controlling the carbon concentration, nitrogen concentration, and oxygen concentration in the silicon wafer to predetermined values (for example, Patent Document 2).

There is further disclosed a technique for preventing generation of defects of a silicon wafer by heat treating the wafer within a temperature range of 1050° C. or more in a hydrogen atmosphere, an argon atmosphere, or a mixed atmosphere thereof (for example, Patent Document 3).

In recent years, a technique for subjecting a silicon wafer to rapid heating/cooling thermal process (RTP: Rapid Thermal Process) is known as a technique for producing, in a high productivity and an easy manner, a silicon wafer with few defects at the surface portion of the wafer.

For example, there is disclosed a technique for obtaining a silicon wafer having excellent Gate Oxide Integrity (GOI) characteristics with less faults due to residual crystal defects formed with OSF or the like as a nucleus or residual defects due to mechanical processing such as polishing by subjecting a silicon wafer sliced from a perfect region (a region free from agglomerates of interstitial silicon-type point defects and agglomerates of vacancy-type point defects) including a generation region of ring-shaped oxidation-induced stacking faults to rapid heating/cooling thermal process in a hydrogen atmosphere, an argon atmosphere, or a mixed atmosphere thereof (for example, Patent Document 4).

There is also disclosed a technique for producing a silicon wafer not containing COPs across a major portion of the thickness of the wafer by exposing the silicon wafer to an oxygen-containing atmosphere at least temporarily and heat treating the wafer at a temperature selected so as to satisfy a predetermined inequality (for example, Patent Document 5).

There is further disclosed a technique for producing a silicon substrate having desired oxygen precipitation characteristics without controlling the oxygen concentration in the silicon substrate produced by the CZ process by heat treating the silicon substrate in a 100% nitrogen atmosphere, a 100% oxygen atmosphere, or a mixed atmosphere of oxygen and nitrogen while setting the maximum retention temperature from 1125° C. to the melting point of silicon and a retention time at 5 seconds or more and then quenching the resulting substrate at a cooling rate of 8° C./sec or more from the maximum retention temperature (for example, Patent Document 6).

In addition, there is known a technique comprising pulling a silicon single crystal ingot containing a region having a concentration less than the minimum interstitial silicon concentration at which interstitial dislocations can be formed, which region belongs to a perfect region having therein neither agglomerates of an interstitial silicon-type point defects nor agglomerates of vacancy-type point defects and at the same time, having an oxygen concentration of from $0.97 \times 10^{18}$ to $1.4 \times 10^{18}$ atoms/cm$^3$ and retaining a silicon wafer sliced from the ingot for from 30 to 120 minutes at from 700 to 900° C. in a mixed gas atmosphere of a silane compound and dinitrogen monoxide (for example, Patent Document 7).

There is known a technique for obtaining a silicon substrate having a sufficient mechanical strength by heating a substrate at a temperature of 1100° C. or more, but less than Temperature T represented by a specific relational expression for at least 10 minutes, thereby outwardly diffusing an oxygen solid solution present in the surface layer (for example, Patent Document 8).

In addition, as regards the silicon wafer (hereinafter sometimes simply referred to as a "wafer") used as a substrate for forming a semiconductor device, a silicon wafer after mirror polishing is generally subjected to a heat treatment (annealing) in a predetermined environment for the purpose of raising the yield in the semiconductor device process.

In a related-art examples of the heat treatment technique, there is a technique of performing a rapid heating/cooling thermal process (RTP: Rapid Thermal Processing) at a high temperature of 1,300° C. or more in an oxidizing atmosphere, thereby eliminating a crystal defect. Such RTP is advantageous in that unlike a related-art heat treatment at a high temperature for a long time, even when the solid-solution oxygen in the wafer surface layer is not out-diffused, a defect-free layer (DZ layer: Denuded Zone) can be formed without reducing the concentration of solid-solution oxygen in the wafer surface layer.

Accordingly, even in the case of a silicon wafer having a void defect (COP: Crystal Originated Particle), by performing the above-described RTP, the effect of suppressing extension of a dislocation in the device production process is enhanced and moreover, a wafer having a DZ layer can be produced at a low cost.

However, in the wafer subjected to RTP in an oxidizing atmosphere at a high temperature of 1,300° C. or more, the range of DZ layer is wide and it is difficult to sufficiently getter impurities or suppress generation of a slip ascribable to a thermal stress.

In this respect, for example, a method of performing RTP in a nitrogen or inert atmosphere and controlling the cooling rate, thereby allowing excess vacancies to remain in the wafer and forming oxygen precipitate nuclei, is disclosed in Patent Documents 9 and 10 and the like.

As regards another method for heat-treating a wafer at a high temperature, there is a technique of performing a heat treatment at a high temperature of 1,250° C. or more for 1 hour or more in an inert gas or reducing gas atmosphere, thereby out-diffusing solid-solution oxygen in the wafer surface part and eliminating COP, BMD (Bulk Micro Defect) and the like (see, for example, Patent Document 11).

However, in the heat treatment method described in Patent Document 11, since a heat treatment is performed for a long time, the productivity decreases and the production cost at the heat treatment increases.

Also, the surface part of a wafer subjected to a long-time heat treatment undergoes reduction of the concentration of solid-solution oxygen in the silicon resulting from out-diffusion of oxygen and when such a wafer is used in the device process, the dislocation generated by the application of stress or distortion produced in the device process is liable to extend, giving rise to reduction of the device yield.

Furthermore, because of the heat treatment for a long time, a problem of readily producing a slip in the wafer occurs also during the heat treatment.

For these reasons, in recent years, a technique of subjecting a silicon wafer to RTP on a second time scale at a high temperature of 1,150° C., thereby forming the defect-free layer in the wafer surface part working out to a device active region, is being used (see, for example, Patent Document 12).

However, in the silicon wafer produced using such a technique as described in Patent Document 12, the density of BMD formed in the inside of wafer (hereinafter referred to as a "bulk part") is about $5.0 \times 10^9$ cm$^{-3}$ at a maximum and enhancement of the BMD density in the bulk part is limited.

Also, in Patent Document 12, it is not indicated that a slip produced in the wafer during the heat treatment can be suppressed.

On the other hand, as shown in Patent Document 6, there is a technique where a silicon substrate produced by a CZ method is heat-treated in an atmosphere of 100% nitrogen, 100% oxygen or a mixture of oxygen and nitrogen by setting the maximum holding temperature to a range from 1,125° C. to the melting point of silicon and the holding time to 5 seconds or more and then rapidly cooled at a cooling rate of 8° C./sec or more from the maximum holding temperature, and a silicon substrate having desired oxygen precipitation properties can be thereby obtained without controlling the oxygen concentration.

By using this technique, a high-density BMD with an internal defect density (BMD density in the bulk part) of about $1.0 \times 10^{10}$ cm$^{-3}$ at a maximum can be formed.

[Patent Document 1] Japanese Patent Laid-Open No. 1996-330316
[Patent Document 2] Japanese Patent Laid-Open No. 2006-188423
[Patent Document 3] Japanese Patent Laid-Open No. 2002-231726
[Patent Document 4] Japanese Patent Laid-Open No. 2003-224130
[Patent Document 5] Japanese Patent Laid-Open No. 2003-297840
[Patent Document 6] Japanese Patent Laid-Open No. 2000-31150
[Patent Document 7] Japanese Patent Laid-Open No. 2002-134513
[Patent Document 8] Japanese Patent Laid-Open No. 1993-291097
[Patent Document 9] Japanese Patent Laid-Open No. 2007-534579
[Patent Document 10] Japanese Patent Laid-Open No. 2005-522879
[Patent Document 11] Japanese Patent Laid-Open No. 2006-261632
[Patent Document 12] Japanese Patent Laid-Open No. 2001-509319

In the technique described in Patent Document 1, control of pulling conditions is very difficult because grown-in defects appear due to slight variations in the pulling conditions.

The technique for forming an epitaxial layer described in Patent Document 2 needs a high cost. In this technique, an epitaxial layer having, for example, a thickness of 5 μm or more should be formed in order to form a device active region. This technique is therefore very poor in productivity and requires a high cost.

The heat treatment technique described in Patent Document 3 is not preferred because it needs long heat treatment time and is therefore poor in productivity, and in addition, slip tends to occur during heat treatment.

In the rapid heating/cooling thermal process described in Patent Document 4, reduction in grown-in defects is limited because this technique is premised on the use, as a silicon wafer before the rapid thermal process, of a perfect region having therein neither agglomerates of interstitial silicon-type point defects nor agglomerates of vacancy-type point defects.

According to the rapid heating/cooling thermal process described in Patent Document 5, it is advantageous to use, as a starting material for thermal process, a silicon wafer obtained from single crystals controlled to generate markedly small COPs at a high concentration. A reduction in grown-in defects in the rapid heating/cooling thermal process is therefore also limited in this technique.

The object of the rapid heating/cooling thermal process described in Patent Document 6 is to obtain a silicon substrate having desired oxygen precipitation characteristics without controlling the oxygen concentration in the silicon substrate produced by the CZ process and not to reduce grown-in defects in the device active region of the silicon wafer.

The techniques described in Patent Documents 7 and 8 aim to remove grown-in defects in the device active region or to obtain a high gettering effect but are not developed in consideration of the precipitation of BMD in the device active region. The BMD, when precipitated in a bulk region other than the device active region, is usually effective because it has a gettering effect of heavy metals, but it may be a cause for reducing a device yield when precipitated in the device active region. Moreover, in a silicon wafer having a high oxygen concentration, a precipitation density of BMD becomes high in the bulk region, while a precipitation density in the device active region becomes also high.

The thermal process of the silicon wafer according to Patent Documents 7 and 8 is effective for making grown-in defects in the device active region defect-free or obtaining high gettering effects, but there is a possibility of slip dislocation occurring in the silicon wafer by the thermal process. Improvement also in thermal strength of the silicon wafer is therefore effective for preventing generation of slip dislocation.

For improving the thermal strength, a technique for heightening a concentration of oxygen solid solution in a silicon wafer is known. An increase in the concentration of oxygen solid solution raises a precipitation density of BMD in the device active region as described above.

According to the method described in Patent Documents 9 and 10, it is difficult to sufficiently eliminate the above-descried COP, but many oxygen precipitate nuclei can be formed in the inside of wafer by controlling the cooling rate and the precipitate density of BMD can be raised, whereby impurities can be gettered.

In this way, for raising the precipitate density of BMD, increase of the cooling rate is effective.

However, such rapid cooling has a problem that the thermal stress attributable to the temperature distribution in the wafer plane increases and a slip is liable to be produced.

Accordingly, a simple and easy method for RTP, where the DZ layer can be formed by eliminating COP in the wafer surface layer and generation of a slip can be suppressed by forming BMD at a high density in the bulk, is demanded.

SUMMARY OF INVENTION

A first illustrative aspect of the present invention provides a method of manufacturing a silicon wafer capable of improving a reduction capacity of grown-in defects while suppressing generation of slip during rapid heating/cooling thermal process.

A second illustrative aspect of the present invention provides a silicon wafer capable of removing grown-in defects, having a high gettering effect, capable of preventing precipitation of BMD in the device active region, and capable of improving thermal strength of the device active region.

A third illustrative aspect of the present invention provides a method for heat-treating a silicon wafer by RTP, where a DZ layer can be formed by eliminating COP in the waver surface layer and generation of a slip can be suppressed by forming BMD at a high temperature in the bulk.

A fourth illustrative aspect of the present invention provides a method for heat-treating a silicon wafer, where crystal defects such as COP can be eliminated in the wafer surface part working out to a device active region, BMD can be formed at a high density in the bulk, and generation of a slip during RTP can be suppressed.

According to a first aspect of the invention, a method of manufacturing a silicon wafer according to the invention comprises subjecting a silicon wafer produced from a silicon single crystal ingot grown by the Czochralski process to rapid heating/cooling thermal process at a maximum operating temperature of 1300° C. to 1380° C. in an oxidizing gas atmosphere having an oxygen partial pressure of 20% to 100%.

The production process having such a constitution can improve a reduction capacity of grown-in defects while suppressing generation of slip during the rapid heating/cooling thermal process.

The maximum operating temperature is preferably 1350° C. to 1380° C.

The production process having such a constitution can improve a reduction capacity of grown-in defects further while suppressing generation of slip during the rapid heating/cooling thermal process.

A variation in thickness, within the wafer plane, of a silicon oxide film formed by the rapid heating/cooling thermal process is preferably within 1.5% in terms of a ratio calculated from $(t_{ox}max - t_{ox}min)/(t_{ox}ave)$ wherein $t_{ox}max$ represents a maximum film thickness, $t_{ox}min$ represents a minimum film thickness, and $t_{ox}ave$ represents an average film thickness.

The production process having such a constitution can suppress generation of slip during the rapid heating/cooling thermal process further.

Agglomerates of supersaturated vacancy-type point defects existing at least in the device active region of a silicon wafer before the rapid heating/cooling thermal process each has preferably a size of 180 nm or less at a maximum in terms of a diameter of a sphere having a similar volume to that of the agglomerate.

The production process having such a constitution can definitely eliminate the agglomerate of supersaturated vacancy-type point defects generated as a result of the rapid heating/cooling thermal process.

The growth of the silicon single crystal ingot is performed by nitrogen-free doping.

The production process having such a constitution can stabilize the size and density of grown-in defects in the axial direction of thus-grown silicon single crystal ingot.

A concentration of oxygen solid solution in the silicon single crystal ingot preferably falls within a range of $5 \times 10^{17}$ atoms/cm$^3$ to $1.3 \times 10^{18}$ atoms/cm$^3$.

The production process having such a constitution can provide a silicon wafer having a relatively large LSTD-density reduction ratio in the rapid heating/cooling thermal process and having a high oxygen precipitation density.

The surface of the silicon wafer is preferably polished after the rapid heating/cooling thermal process.

The production process having such a constitution can easily produce a high-quality silicon wafer with less grown-in defects even when COPs have remained in the vicinity of the surface of the wafer.

It is preferred to eliminate, from at least the device active region of the silicon wafer, the agglomerate of supersaturated vacancy-type point defects and oxygen precipitates to form a DZ layer and an oxygen solid solution is introduced into the DZ layer by applying the rapid heating/rapid quenching thermal process.

The production process having such a constitution can suppress elongation of dislocations because a concentration of oxygen solid solution in the DZ layer becomes high and the dislocation induced by the stress is pinned by the oxygen solid solution.

A silicon wafer according to the invention comprises, in a defect-free region of the silicon wafer including at least the device active region thereof, a high oxygen concentration region having a concentration of oxygen solid solution of $0.7 \times 10^{18}$ atoms/cm$^3$ or more and at the same time, the defect-free region contains interstitial silicon in a supersaturated state.

The concentration of solid oxygen solution in the defect-free region is preferably higher than that in a bulk region present in a deeper portion of the silicon wafer than the defect-free region.

The concentration of oxygen solid solution preferably shows a gradual decrease from the high oxygen concentration region toward the surface of the silicon wafer.

A method for heat-treating a silicon wafer is provided with: when a wafer sliced from a silicon single crystal ingot produced by a Czochralski method is subjected to a rapid heating/cooling thermal process, setting a maximum achievable temperature to a range from 1,300° C. to a melting point of silicon; setting an atmosphere in a holding state at the maximum achievable temperature to an oxidizing gas atmosphere having an oxygen partial pressure of 20% to 100% on a surface side of the wafer; and setting an atmosphere on a back side of the wafer to a non-oxidizing gas atmosphere.

By performing such a heat treatment, on the wafer surface side, a DZ layer is formed and at the same time, the concentration of solid-solution oxygen becomes high, whereas on the wafer back side, the residual vacancy concentration rises high and therefore, high-density BMD can be formed in the bulk of the wafer.

In the method for heat-treating a silicon wafer above, the atmosphere on the wafer surface side in RTP may be set to a non-oxidizing gas atmosphere in the temperature rise process and after reaching the maximum achievable temperature, switched to an oxidizing gas atmosphere having an oxygen partial pressure of 20% to 100%.

By such switching of the atmosphere gas, COP on the surface side can be more completely eliminated and a higher-quality DZ layer can be obtained.

Also, in the temperature drop process in RTP, both the surface side and the back side of the wafer may be set to a non-oxidizing gas atmosphere.

By controlling the atmosphere gas in this way, the thickness of the DZ layer can be made thin. That is, the production region of an oxygen precipitate can be brought close to the device formation region, whereby the impurity gettering effect can be enhanced.

Furthermore, the flow rate of an oxidizing gas supplied to create an oxidizing gas atmosphere on the surface side of the wafer may be smaller than the flow rate of a non-oxidizing gas supplied to create a non-oxidizing gas atmosphere on the back side of the wafer.

By adjusting the flow rate of the supply gas in this way, an oxidation reaction on the wafer surface is uniformly performed in the plane and a high-quality DZ layer can be formed.

In another method for heat-treating a silicon wafer obtained by slicing a silicon single crystal ingot produced by a Czochralski method, a rapid heating/cooling thermal process is performed in an oxygen-containing atmosphere by setting a maximum achievable temperature to a range from 1,300° C. to a melting point of silicon and setting a temperature drop rate from the maximum achievable temperature to a range from 50° C./sec to 145° C./sec.

By using such a method, crystal defects such as COP in the wafer surface part working out to a device active region can be eliminated, BMD can be formed at a high density in the bulk part, and generation of a slip during RTP can be suppressed.

Incidentally, the surface part as used in the present invention indicates a surface layer region to a depth of about 5 μm to 25 μm from the surface where a semiconductor device is formed, and the bulk part indicates a lower layer region deeper than the surface part.

The temperature drop rate may be from 50° C./sec to 70° C./sec.

By controlling the temperature drop rate to such a range, BMD can be formed at a high density in the bulk part while greatly suppressing generation of a slip during RTP.

Alternatively, the temperature drop rate may be from 90° C./sec to 145° C./sec.

Also in the case of controlling the temperature drop rate to such a range, BMD can be formed at a higher density in the bulk part while suppressing generation of a slip during RTP.

Furthermore, in the oxygen-containing atmosphere, the oxygen partial pressure may be set to a range from 20% to 100%.

By setting the oxygen partial pressure to the range above, the ability of eliminating crystal defects in the wafer surface part can be raised.

The wafer subjected to a heat treatment may be obtained by slicing the silicon single crystal ingot from a region where a vacancy-type point defect is predominantly present.

Use of such a silicon wafer enables raising the pulling rate at the growth of a silicon single crystal ingot, so that the productivity can be enhanced and at the same time, the cost of ingot growth can be reduced.

The invention provides a production process of a silicon wafer capable of improving a reduction capacity of grown-in defects while preventing generation of slip during a rapid heating/cooling thermal process. By using this production process, a silicon wafer having a high quality with less grown-in defects can be produced with high productivity at a low cost.

The invention also provides a silicon wafer capable of removing grown-in defects, having a high gettering effect, capable of preventing precipitation of BMD in the device active region, and capable of improving thermal strength of the device active region.

According to the method for heat-treating a silicon wafer of the present invention, in the wafer surface layer, disappearance of COP and formation of DZ layer are achieved and at the same time, in the bulk, BMD is formed at a high density, so that generation of a slip can be suppressed and a high-quality wafer can be produced at a low cost.

According to the method for heat-treating a silicon wafer of the present invention, a heat treatment method for a silicon wafer, ensuring that crystal defects such as COP can be eliminated in the wafer surface part working out to a device active region and BMD can be formed at a high density in the bulk part and further that generation of a slip during RTP can be suppressed, is provided.

Accordingly, a silicon wafer subjected to a heat treatment by the method of the present invention greatly contributes to enhancing the yield in the semiconductor device process.

Other aspects and advantages of the invention will be apparent from the following description, the drawings and the claims.

BRIEF DESCRIPTION OF THE DRAWINGS

FIGS. 3A to 3C are schematic views for describing an LSTD-density reduction mechanism relating to the invention.

FIGS. 4A to 4C are schematic views for describing a remaining mechanism of COP in the vicinity of the wafer surface in the LSTD density reduction mechanism relating to the invention;

FIGS. 10A to 10C are schematic views illustrating one example of a temperature process in a rapid heating/cooling thermal process.

DETAILED DESCRIPTION OF EXEMPLARY EMBODIMENTS

A first embodiment of the invention will hereinafter be described referring to accompanying FIGS. 1-8.

Figure 1:
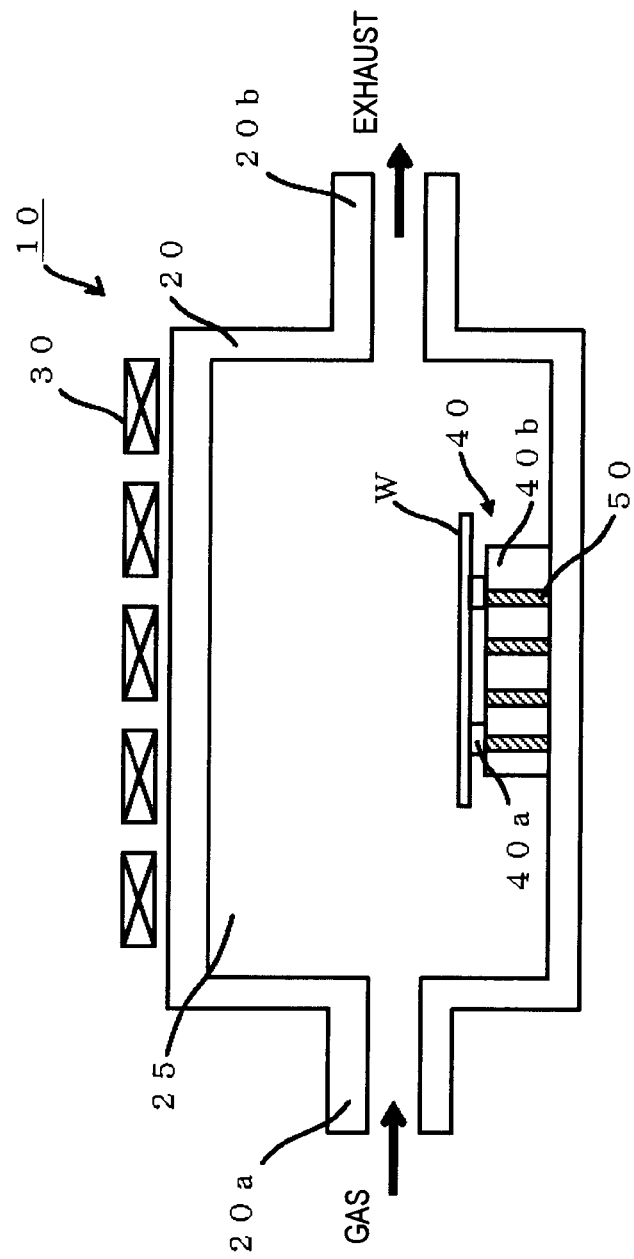
FIG. 1 is a schematic cross-sectional view illustrating one example of an RTP apparatus employed in a production process of a silicon wafer according to the invention.

FIG. 1 is a schematic cross-sectional view illustrating one example of an RTP apparatus used in the production process of a silicon wafer of the invention.

An RTP apparatus 10 to be used for the production process of the silicon wafer of the invention is equipped with, as illustrated in FIG. 1, a reaction tube 20 having an atmospheric gas inlet 20a and an atmospheric gas outlet 20b, a plurality of lamps 30 disposed separately and above the reaction tube 20, and a wafer support 40 for supporting a wafer W in a reaction space 25 in the reaction tube 20. The wafer support 40 has a cyclic susceptor 40a for directly supporting the wafer W and a stage 40b for supporting the susceptor 40a. The reaction tube 20 is made of, for example, quartz. The lamp 30 is made of, for example, a halogen lamp. The susceptor 40a is made of, for example, silicon. The stage 40b is made of, for example, quartz.

When the wafer W is subjected to the rapid heating/cooling thermal process (RTP: Rapid Thermal Process) by using the RTP apparatus 10 illustrated in FIG. 1, the wafer W is introduced into the reaction space 25 from an unillustrated wafer inlet of the reaction tube 20, placed on the susceptor 40a of the wafer support 40. Then, an atmospheric gas which will be described later is introduced from the atmospheric gas inlet 20a and at the same time, the surface of the wafer W is exposed to the lamp 30. A temperature control in the reaction space 25 of the RTP apparatus 10 is effected by measuring an average temperature within the surface, in the diameter direction of the wafer, of the lower portion of the wafer W by using a plurality of radiation thermometers buried in the stage 40b of the wafer support 40 and controlling (ON-OFF control of respective lamps or control of emission intensity of light) the plurality of halogen lamps 30 based on the temperature thus measured.

The production process of a silicon wafer according to the invention will hereinafter be described.

The production process of a silicon wafer according to the invention comprises subjecting a silicon wafer produced from a silicon single crystal ingot grown by the Czochralski process to rapid heating/cooling thermal process at a maximum operating temperature of 1300° C. to 1380° C. in an oxidizing gas atmosphere having an oxygen partial pressure of 20% to 100%.

Growing of the silicon single crystal ingot by the Czochralski process is performed in a known manner.

Described specifically, the silicon single crystal ingot is produced by heating polycrystalline silicon filled in a quartz crucible into a silicon melt, bringing a seed crystal into contact with the silicon melt from above the liquid surface thereof, pulling up the resulting seed crystal while rotating the crystal and the quartz crucible, and extending it to a predetermined diameter to form a straight cylindrical portion.

The silicon single crystal ingot thus obtained is then processed into a silicon wafer in a known manner.

The silicon wafer is produced by slicing the silicon single crystal ingot into a wafer form by using an inner diameter blade or wire saw, and performing various processing steps such as chamfering of the peripheral portion of the ingot, lapping, etching, and polishing. The processing steps described above are only exemplary and the invention is not limited only to these processing steps.

The silicon wafer thus obtained is then subjected to a rapid heating/cooling thermal process at a maximum operating temperature of 1300° C. to 1380° C. in an oxidizing gas atmosphere having an oxygen partial pressure of 20% to 100%.

The rapid heating/cooling thermal process is performed, for example, using the RTP apparatus 10 as illustrated in FIG. 1 in an oxidizing gas atmosphere having an oxygen partial pressure of 20% to 100%. The term "oxygen partial pressure" as used herein means an oxygen partial pressure in a mixed gas (atmospheric gas) when it is supplied to the reaction tube 20.

Use of, as the atmospheric gas, an oxidizing gas atmosphere having an oxygen partial pressure of 20% to 100% enables to drastically improve a grown-in defect reduction capacity in the rapid heating/cooling thermal process.

The oxygen partial pressure in the oxidizing gas atmosphere less than 20% is not preferred because it extremely deteriorates a reduction capacity of an LSTD density in the rapid heating/cooling thermal process.

The term "oxidizing gas atmosphere" as used herein means a mixed gas having an oxygen partial pressure of 20% to 100%, or a 100% oxygen gas. A gas contained in the mixed gas other than the oxygen gas is preferably an inert gas.

When a nitrogen gas is used as a gas other than the oxygen gas, a nitride film is inevitably formed on the surface of the silicon wafer in the rapid heating/cooling thermal process. A new etching step for removing the nitride film should be added so that such an increase in the number of steps is not preferred. When a hydrogen gas is used as a gas other than the oxygen gas, a mixed gas of oxygen and hydrogen is not preferred because it poses a risk of explosion.

As the inert gas, use of an argon gas as a main inert gas is preferred. Use of the argon gas enables to smoothly perform the rapid heating/cooling thermal process without causing the above-described inconveniences.

Figure 2:
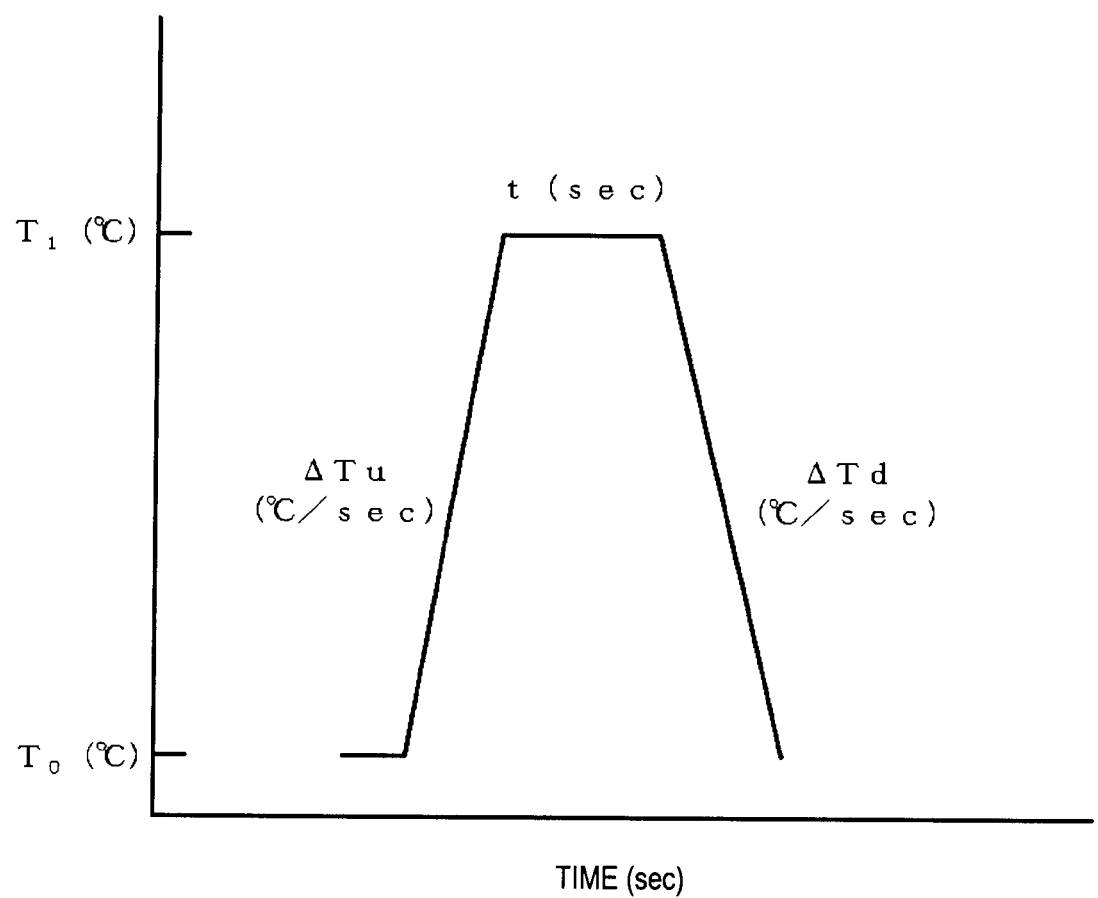
FIG. 2 is illustration of one example of a temperature process in a rapid heating/cooling thermal process.

FIG. 2 is a schematic view illustrating one example of a temperature process in the rapid heating/cooling thermal process.

The rapid heating/rapid quenching thermal process is performed, for example, by using the RTP apparatus 10 as illustrated in FIG. 1 and the temperature process as illustrated in FIG. 2.

Described specifically, the silicon wafer thus produced is placed in the reaction tube 20 of the RTP apparatus 10 at a desired temperature $T_0$ (for example, 500° C.), heated at a desired temperature increasing rate $\Delta Tu$ (for example, 75° C./sec) to a desired maximum operating temperature $T_1$ (1300° C. to 1380° C.) in an oxidizing gas atmosphere having an oxygen partial pressure of 20% to 100%, and retained at the desired maximum operating temperature $T_1$ for a desired time t (for example, 15 sec). Then, the temperature is decreased at a desired temperature decreasing rate $\Delta Td$ (for example, 25° C./sec) to a desired temperature $T_0$ (for example, 500° C.). The silicon wafer thus treated is then taken out from the reaction tube 20.

The term "rapid heating/cooling thermal process" as used herein means a thermal process having a temperature process including a high-speed temperature increasing rate $\Delta Tu$, a short retention time t at a maximum operating temperature $T_1$, and a high-speed temperature decreasing rate $\Delta Td$.

The high-speed temperature increasing rate $\Delta Tu$ herein is preferably 10° C./sec or more; the short retention time is preferably 1 sec to 60 sec, and a high-speed temperature decreasing rate $\Delta Td$ is preferably 10° C./sec or more. Such a temperature process enables to realize a rapid heating/cooling thermal process having a high productivity.

The maximum operating temperature $T_1$ is, as described above, preferably 1300° C. to 1380° C.

The term "maximum operating temperature $T_1$" as used herein means an average temperature at nine points within the surface, in the diameter direction, of the lower portion of the wafer W when the wafer W is placed in the RTP apparatus 10 as illustrated in FIG. 1.

By adjusting the maximum operating temperature $T_1$ to 1300° C. to 1380° C., it is possible to improve the reduction capacity of grown-in defects while suppressing generation of slip during the rapid heating/cooling thermal process.

The maximum operating temperature $T_1$ less than 1300° C. is not preferred because an LSTD density reduction capacity in the rapid heating/cooling thermal process decreases. The maximum operating temperature $T_1$ exceeding 1380° C., on the other hand, is also not preferred because a large slip occurs in the silicon wafer subjected to the rapid heating/cooling thermal process. In addition, the maximum operating temperature $T_1$ exceeding 1380° C. is not preferred because it accelerates deterioration of the RTP apparatus because of a problem in the durability of the RTP apparatus, which may worsen the device characteristics of the silicon wafer.

As described above, the production process of a silicon wafer according to the invention has such a constitution so that it can improve the reduction capacity of grown-in defects while suppressing generation of slip during the rapid heating/cooling thermal process. A silicon wafer having a high quality with less grown-in defects can therefore be produced with high productivity at a low cost.

Next, a reduction mechanism of an LSTD density in the invention will be considered. FIGS. 3A to 3C are schematic views for illustrating a reduction mechanism of an LSTD density in the invention.

When a sharp temperature increase for the rapid heating/cooling thermal process is performed as in the invention in an oxidizing gas atmosphere having an oxygen partial pressure as high as 20% or more, the surface of the silicon wafer is oxidized and oxygen ($O_2$) and interstitial-Si (which will hereinafter be called "i-Si") are introduced into the silicon wafer abruptly (FIG. 3A). During the high-temperature process, oxygen contained in an inner-wall oxide film formed on the inner wall of COP then dissolves in the silicon wafer and an oxygen solid solution (Oi) is formed in the wafer (FIG. 3B). Due to the formation of this oxygen solid solution (Oi), the inner-wall oxide film is removed from the COP, the i-Si is filled in the COP from which the inner-wall oxide film has been removed, leading to disappearance of the COP, and as a result, a so-called DZ (Denuded Zone) layer is formed (FIG. 3C). Although not illustrated, oxide precipitates present in the DZ layer also disappear simultaneously with the disappearance of the COP.

In the DZ layer thus formed, the oxygen solid solution remains (FIG. 3C). Since a concentration of the oxygen solid solution in the DZ layer increases and dislocation which has occurred due to a stress from the backside of the wafer is pinned by the oxygen solid solution, the elongation of the dislocation can be suppressed.

In addition, the DZ layer having interstitial silicon introduced therein is supersaturated with the interstitial silicon so that re-precipitation of the oxygen solid solution in the DZ layer which will otherwise occur by the heat treatment (for example, heat treatment in a device process) after the rapid heating/cooling thermal process can be prevented.

In the production process of a silicon wafer in the invention, the COP may sometimes remain in the vicinity of the wafer surface. FIGS. 4A to 4C are schematic views for illustrating a remaining mechanism of COP in the vicinity of the wafer surface in an LSTD-density reduction mechanism relating to the invention.

When the rapid heating/cooling thermal process is performed in an oxidizing gas atmosphere having an oxygen partial pressure as high as 20% or more as in the invention, the wafer is, in the vicinity of the surface thereof, supersaturated with oxygen. The oxygen contained in the inner-wall oxide film formed on the inner wall of COP generated in the vicinity of the surface becomes insoluble in the wafer. The inner-wall oxide film of the COP formed in the vicinity of the wafer surface therefore remains inevitably. Since i-Si is not filled in the COP having a remaining inner-wall oxide film, the COP in the vicinity of the surface of the wafer sometimes cannot be eliminated (FIGS. 4A to 4C).

In such a case, a silicon wafer having a high quality with less grown-in defects can be produced easily by removing the COP which has remained in the vicinity of the wafer surface by polishing.

The polishing may be effected only by finish polishing which is a known technique or a known combination technique of secondary polishing and finish polishing.

The maximum operating temperature $T_1$ is preferably 1350° C. to 1380° C.

The production process having such a constitution can improve a grown-in defect reduction capacity further while suppressing generation of slip during the rapid heating/cooling thermal process. Details of such an effect will be described later in Examples 1-1 to 1-4.

The variation in thickness, in the wafer plane, of a silicon oxide film formed by the rapid heating/cooling thermal process is preferably within 1.5% in terms of a ratio calculated from $(t_{ox}max - t_{ox}min)/(t_{ox}ave)$ wherein $t_{ox}max$ represents a maximum film thickness, $t_{ox}min$ represents a minimum film thickness, and $t_{ox}ave$ represents an average film thickness.

The production process having such a constitution can suppress generation of slip during the rapid heating/cooling thermal process further.

The above-described film thickness ratio can be determined by measuring the thickness of the silicon oxide film formed on the surface of the silicon wafer subjected to the rapid heating/cooling thermal process by using ellipsometry measurement. Control of the film thickness ratio can be performed, when described referring to the RTP apparatus 10 illustrated in FIG. 1, by controlling each of a plurality of lamps 30 (ON-OFF control of lamps or control of emission intensity of light) disposed apart above the reaction tube 20 or controlling the flow rate of the atmospheric gas.

The agglomerate of supersaturated vacancy-type point defects in at least the device active region of the silicon wafer before the rapid heating/cooling thermal process has preferably a size of 180 nm or less at a maximum in terms of a diameter of a sphere having a volume equal to that of the agglomerate.

The production process having such a constitution can definitely eliminate the agglomerates of supersaturated vacancy-type point defects which have been generated by the rapid heating/cooling thermal process.

Nitrogen doping treatment is performed to adjust the size of the agglomerate of the supersaturated vacancy-type point defects generated during the growth of silicon single-crystal ingot. Such nitrogen doping treatment is effected, for example, by filling the quartz crucible with a silicon wafer having thereon a silicon nitride film at the time when polycrystalline silicon is filled in the crucible.

Such nitrogen doping treatment however tends to cause a gradual increase in the nitrogen doping amount from the upper portion to the lower portion of the straight cylindrical portion of the thus-grown silicon single crystal ingot. In such a case, the size and density of the grown-in defects in the axial direction of the thus-grown silicon single crystal ingot become uneven. This unevenness leads to a variation in each of the size and density of grown-in defects in the axial direction of the silicon single crystal ingot. As a result, the quality of the silicon wafer available by processing of the silicon single crystal ingot and then, rapid heating/cooling thermal process varies widely between lots of the ingot, in other words, the quality varies in one silicon single crystal ingot.

The grown-in defects reduction capacity in the rapid heating/cooling thermal process in the invention is improved so that grown-in defects can be reduced by the rapid heating/cooling thermal process, which is a post-treatment step, without nitrogen doping treatment, in other words without reducing the size of the agglomerate of supersaturated vacancy-type point defects by nitrogen doping treatment.

The production process of a silicon wafer according to the invention including the rapid heating/cooling thermal process can therefore reduce the agglomerates of supersaturated vacancy-type point defects generated during the growth of silicon single crystals even if the silicon single-crystal ingot is grown by nitrogen-free doping. Moreover, a variation in the size and density of the grown-in defects in the axial direction of the silicon single crystal ingot can be stabilized.

When agglomerates of supersaturated vacancy type point defects having a size too large (exceeding 180 nm at a maximum) to be eliminated by the rapid heating/cooling thermal process are generated when nitrogen-free doping is employed for growing the silicon single crystal ingot, nitrogen-free doping and high-speed pulling can be used in combination to decrease the size of the agglomerate of supersaturated vacancy-type point defects to a size range which can be eliminated by the rapid heating/cooling thermal process. The term "high-speed pulling" as used herein means pulling at a rate of 1.2 mm/min or more on average when a silicon wafer having a diameter of 300 mm is produced and at a rate of 1.8 mm/min or more on average when a silicon wafer having a diameter of 200 mm is produced.

The concentration of oxygen solid solution in the silicon single crystal ingot is preferably $5 \times 10^{17}$ atoms/cm$^3$ to $1.3 \times 10^{18}$ atoms/cm$^3$.

The "concentration of oxygen solid solution" as used herein means a value determined from a conversion factor of Old ASTM standards in 1970-1979 Edition.

The method of the invention having such a constitution can provide a silicon wafer having a relatively large LSTD density reduction ratio when subjected to rapid heating/cooling thermal process and having a high oxygen precipitate density.

EXAMPLE 1

Advantages of the first embodiment of the invention will hereinafter be described using Examples 1-1 to 1-4, but the invention is not limited to or by Examples 1-1 to 1-4.

EXAMPLE 1-1

A silicon single crystal ingot having a P type, a crystal plane direction (001), a concentration [Oi] of oxygen solid solution of $1.2 \times 10^{18}$ atoms/cm$^3$ (calculated from a conversion factor based on Old ASTM), and a resistance of from 23 to 25 Ω/cm was produced by the CZ process.

Nitrogen doping treatment was performed by filling the crucible with a silicon wafer coated with a silicon nitride film and a pull rate V was adjusted to 1.2 mm/min on average and at the same time, the pull rate V and a temperature gradient G at 1300° C. in the direction of a crystal axis were controlled to control a V/G ratio in order to prevent generation of dislocation clusters during the growth of a silicon single crystal.

The resulting silicon single crystal ingot was then sliced into a wafer by a wire saw and subjected to beveling, lapping, etching, and polishing to obtain a double-side polished silicon wafer having a diameter of 300 mm.

Then, from the same lot of the silicon wafers thus obtained, several ones were sampled and grown-in defects across the device surface of the silicon wafers thus sampled were observed with an Atomic Force Microscopy (AFM). The maximum value in terms of a diameter of a sphere having a volume equal to that of the grown-in defect thus observed was measured. As a result, the maximum size of COP measured in Example 1-1 was 100 nm.

Then, using an RTP apparatus 10 as illustrated in FIG. 1, a rapid heating/cooling thermal process of the silicon wafers was performed. In Example 1-1, the rapid heating/cooling thermal process was performed by employing, of the temperature process illustrated in FIG. 2, $T_0$: 500° C., $\Delta Tu$: 75° C./sec, t: 15 sec, and $\Delta Td$: 25° C./sec as common conditions and setting $T_1$ at 1250° C. to 1400° C., using a mixed gas of Ar and oxygen as an atmospheric gas, and adjusting the oxygen partial pressure in the mixed gas to 0% (100% Ar gas), 10%, 20%, 30%, 40%, and 100% (100% oxygen gas). The temperature upon this process is an average temperature of nine points within the surface, in the diameter direction of the wafer, of the lower portion of the wafer W measured using a plurality of radiation thermometers 50 buried in the stage 40b of the wafer support 40 as illustrated in FIG. 1.

Next, the LSTD density and slip length of the silicon wafers subjected to the rapid heating/cooling thermal process were measured. The LSTD density was measured using "MO601" (product of Raytex Corporation) and adjusting the laser wavelength to 680 nm and approach depth to 5 µm. The slip length was measured using X-ray topography (XRT 300, 400 diffraction) manufactured by Rigaku Corporation.

Figure 5:
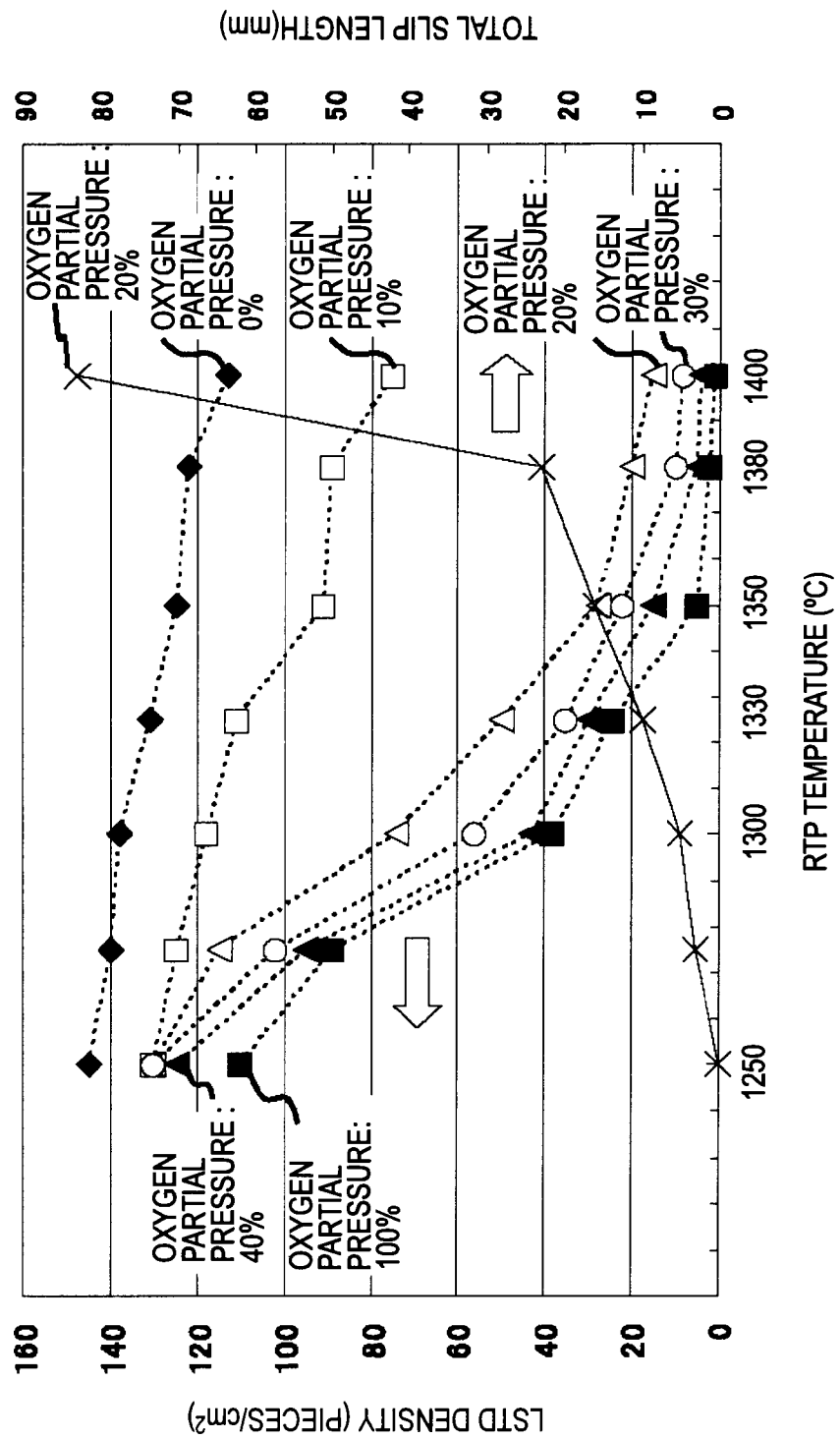
FIG. 5 shows measurement results of LSTD density and generation of overall slip length under each condition after rapid heating/cooling thermal process in Example 1-1.
Figure 6:
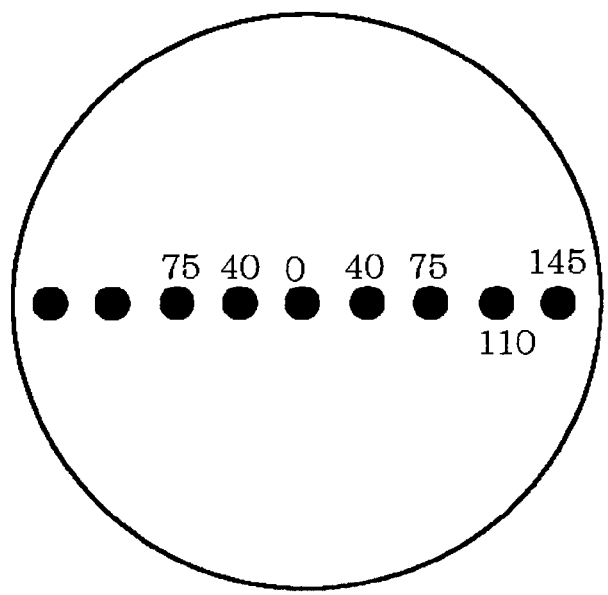
FIG. 6 is a schematic view for describing a measurement point when a variation in the thickness of an oxide film is determined in Example 1-2.

FIG. 5 illustrates measurement results of an LSTD density and generation conditions of overall slip length under each condition after the rapid heating/cooling thermal process in Example 1-1. An RTP temperature (° C.) is plotted on the abscissa, an LSTD density (pieces/cm²) is plotted on the first ordinate (the ordinate on the left side of the paper), and an overall slip length (mm) is plotted on the second ordinate (the ordinate on the right side of the paper). The term "overall slip length" as used herein means a sum of all the slip lengths determined by observing the whole wafer by using X-ray topography and then measuring each length of a plurality of slips found in the whole wafer. In FIG. 5, points indicated by a solid rhombus, a blank square, a blank triangle, a blank circle, a solid triangle, and a solid square are plot data representing an LSTD density relative to an RTP temperature in an atmospheric gas having an oxygen partial pressure of 0%, an oxygen partial pressure of 10%, an oxygen partial pressure of 20%, an oxygen partial pressure of 30%, an oxygen partial pressure of 40%, and an oxygen partial pressure of 100%, respectively. Points indicated by "x" are plot data of overall slip length generated when the oxygen partial pressure was 20%.

From FIG. 5, it has been confirmed that the LSTD density decreases markedly when the oxygen partial pressure is 20% or more compared with when the oxygen partial pressure is 10% or less. It has also been confirmed that the LSTD density decreases greatly at the RTP temperature of 1300° C. or more and the LSTD density stabilizes at a considerably low density at the RTP temperature of 1350° C. or more. The overall slip length shows a slight increasing tendency at the RTP temperature up to 1380° C., but it tends to increase greatly at the RTP temperature exceeding 1380° C. The plot data of overall slip length are at an oxygen partial pressure of 20%. Since the overall slip length shows a similar tendency under the other conditions, those under the other conditions are omitted from FIG. 5.

From FIG. 5, it has been confirmed that the LSTD density decreases greatly and generation of slip is minimized when the oxygen partial pressure is 20% to 100% and the RTP temperature is 1300° C. to 1380° C., preferably 1350° C. to 1380° C.

EXAMPLE 1-2

A double-side polished silicon wafer having a diameter of 300 mm was prepared in a similar manner to Example 1-1 except for the use of a silicon single crystal ingot prepared by the CZ process and having a P type, a crystal plane direction (001), a concentration [Oi] of oxygen solid solution of 1.0× $10^{18}$ atoms/cm³ (calculated from a conversion factor based on Old ASTM), and a resistance of from 28 to 30 Ω/cm.

Then, several silicon wafers were sampled from the same lot and grown-in defects in the device surface of the silicon wafers thus sampled were observed with AFM. The maximum size of the thus-observed grown-in defects in terms of a diameter of a sphere having a volume equal to that of the grown-in defects was measured. As a result, the maximum size of COP measured in Example 1-2 was 100 nm.

Then, using an RTP apparatus 10 as illustrated in FIG. 1, a rapid heating/cooling thermal process of the silicon wafers was performed. In Example 1-2, the rapid heating/cooling thermal process was performed by employing, in the temperature process illustrated in FIG. 2, $T_0$: 500° C., $\Delta Tu$: 75° C./sec, t: 15 sec, $\Delta Td$: 25° C./sec, and an atmospheric gas: a 100% oxygen gas as common conditions and setting $T_1$ at 1300° C., 1350° C., and 1380° C., thus adjusting the process conditions for each sample so that a variation in the thickness of an oxide film formed on the wafer surface changes after the rapid heating/cooling thermal process.

Then, with regard to the silicon wafer subjected to the rapid heating/cooling thermal process, the variation in thickness of the oxide film formed by the rapid heating/cooling thermal process and slip length were measured. The variation in film thickness was measured by the ellipsometry using "Auto ELIII" (product of Rudolph Research Analytical). The variation in film thickness was determined by measuring the film thickness at nine points in total, that is, center (distance: 0 mm) of the wafer and 40 mm, 75 mm, 110 mm, and 145 mm from the center of the wafer in a radius direction. The maximum film thickness $t_{ox}max$, the minimum film thickness $t_{ox}min$, and average film thickness $t_{ox}ave$ in the above nine-point measurements were found and a film-thickness variation, that is, a $(t_{ox}max - t_{ox}min)/(t_{ox}ave)$ ratio was calculated. The slip length was, on the other hand, measured using X-ray tomography manufactured by Rigaku Corporation as in Example 1-1.

Figure 7:
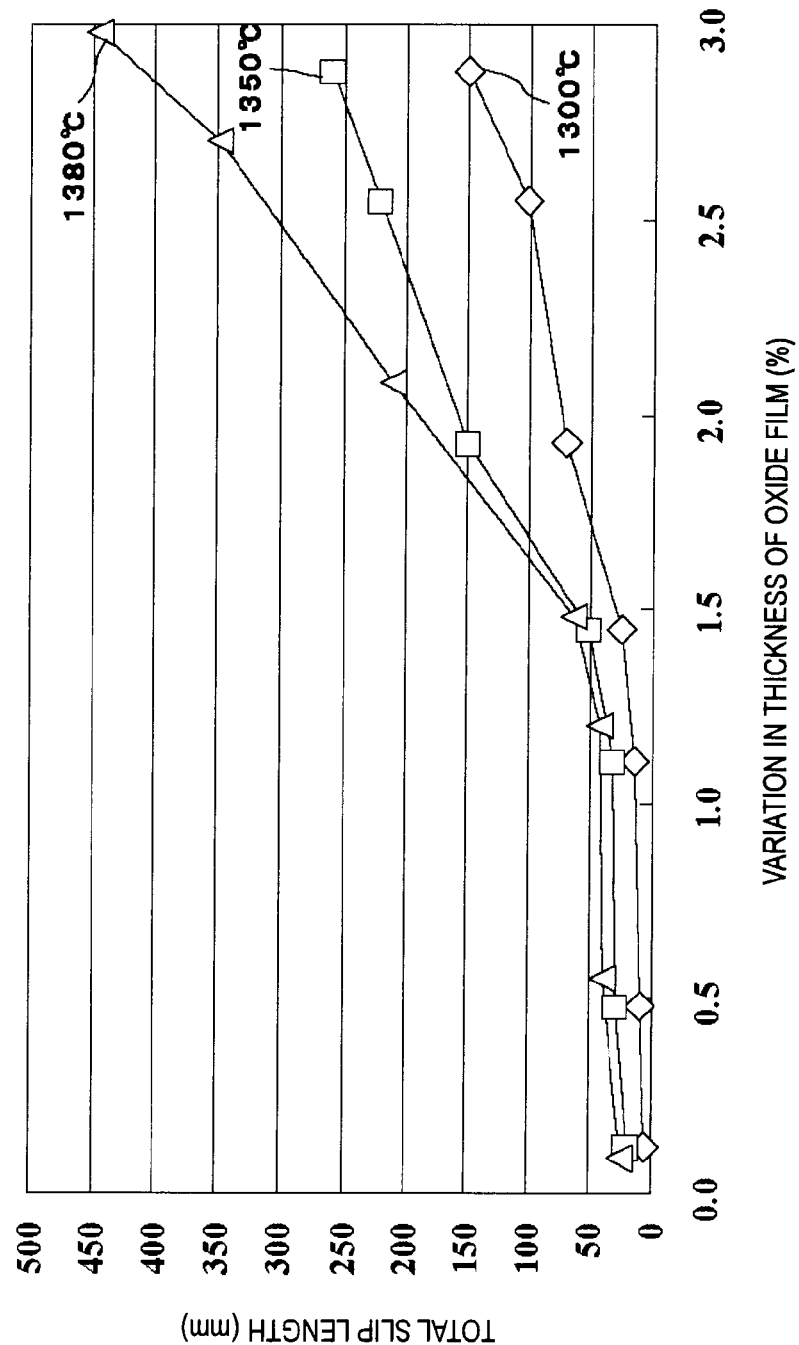
FIG. 7 shows measurement results of generation of slip length relative to a variation of film thickness after rapid heating/cooling thermal process in Example 1-2.

FIG. 7 illustrates measurement results of occurrence of slip length relative to film-thickness variation after the rapid heating/cooling thermal process in Example 1-2. The film-thickness variation (%) of the oxide film is plotted on the abscissa, while the overall slip length (mm) at that time is plotted on the ordinate. In FIG. 7, plotted points indicated by a blank rhombus, a blank square, and a blank triangle are the results at 1300° C., 1350° C., and 1380° C., respectively.

As illustrated in FIG. 7, it can be confirmed that with an increase in the film-thickness variation within the wafer surface, the overall slip length tends to increase. It can also be confirmed that with an increase in temperature, the overall slip length tends to increase. As illustrated in FIG. 7, it can be confirmed that the film thickness variation is preferably 1.5% or less because the overall slip length occurs slightly in this case.

EXAMPLE 1-3

Double-side polished silicon wafers having a diameter of 300 mm but different in concentration of oxygen solid solution were prepared in a similar manner to Example 1-1 except for the use of silicon single crystal ingots prepared by the CZ process and having a P type, a crystal plane direction (001), and a resistance of from 23 to 25 Ωcm and at the same time having a concentration of oxygen solid solution ranging from $0.3 \times 10^{18}$ atoms/cm$^3$ to $1.5 \times 10^{18}$ atoms/cm$^3$.

The concentration of oxygen solid solution was measured using Fourier Transform Infrared Spectrometer (FTIR: "QS-612", trade name; product of Accent Optical Technologies).

Then, several silicon wafers were sampled from the same lot and grown-in defects in the device surface of the silicon wafers thus sampled were observed with AFM. The maximum size in terms of a diameter of a sphere having a volume equal to that of the grown-in defects thus observed was measured. As a result, the maximum size of COP measured in Example 1-3 was 100 nm.

Then, using an RTP apparatus 10 as illustrated in FIG. 1, a rapid heating/cooling thermal process of the resulting silicon wafers was performed. In Example 1-3, the rapid heating/cooling thermal process of samples different in concentration of oxygen solid solution was performed by employing, in the temperature process illustrated in FIG. 2, $T_0$: 500° C., ΔTu: 75° C./sec, t: 15 sec, ΔTd: 25° C./sec, and atmospheric gas: a 100% oxygen gas as common conditions and setting $T_1$ at 1300° C. and 1350° C. The LSTD density in the surface of the silicon wafers was measured prior to the rapid heating/cooling thermal process and the silicon wafers were numbered to enable one-on-one correspondence after the rapid heating/cooling thermal process.

Next, the LSTD density of the silicon wafer subjected to the rapid heating/cooling thermal process was measured and a reduction ratio (LSTD density after RTP/LSTD density before RTP) was calculated based on a change in the LSTD density before and after the rapid heating/cooling thermal process. In addition, an oxygen precipitate density was measured. The LSTD density before and after the rapid heating/cooling thermal process was measured as in Example 1-1 by using "MO601" (trade name; product of Raytex Corporation) and adjusting the laser wavelength and the approach depth to 680 nm and 5 μm, respectively. The oxygen precipitate density was measured using IR tomography ("MO411", trade name; product of Raytex Corporation). As oxygen precipitation heat treatment prior to the sample evaluation by IR tomography, heat treatment was performed at 800° C. for 4 hours in a 100% oxygen gas atmosphere, followed by heat treatment at 1000° C. for 16 hours in the same gas atmosphere (100% oxygen gas).

Figure 8:
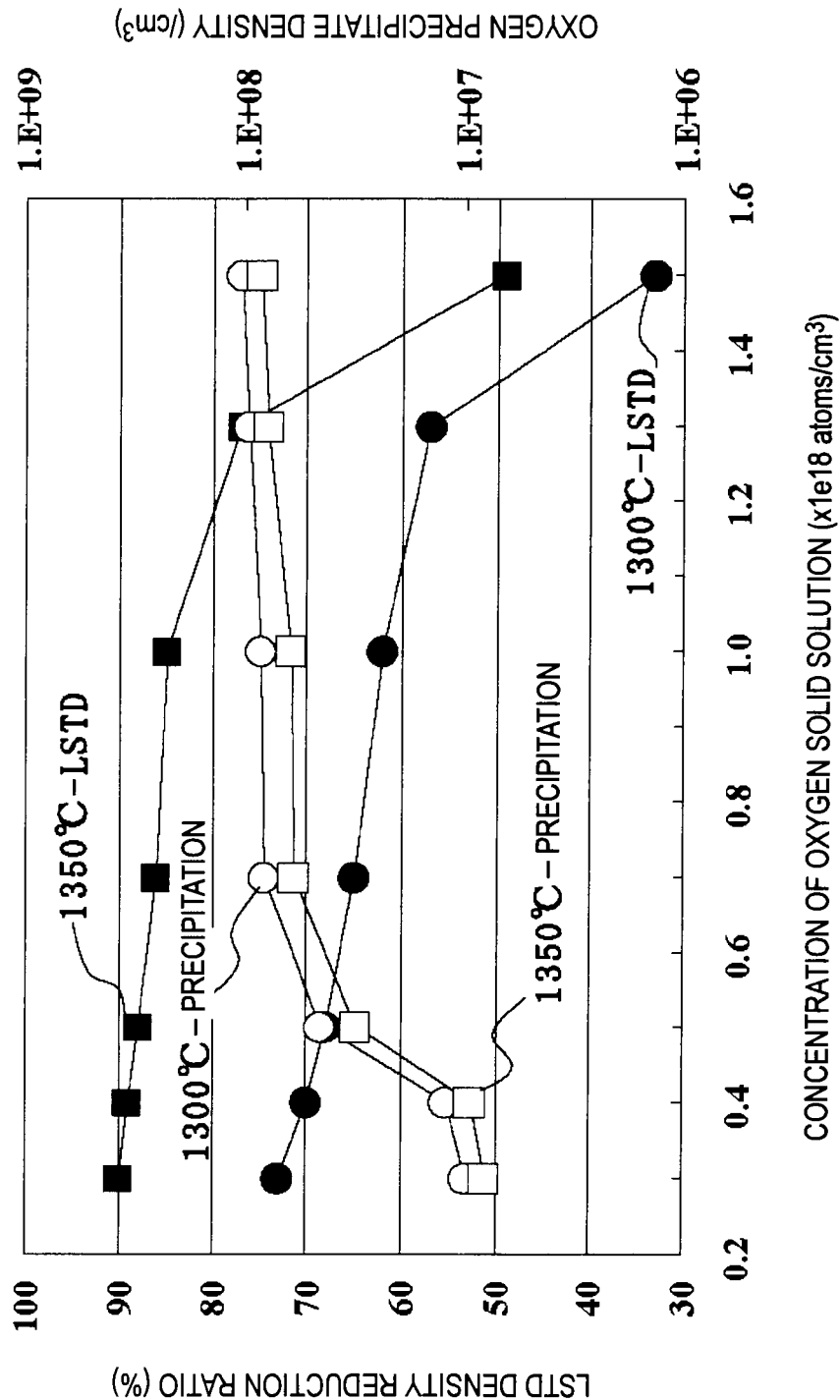
FIG. 8 shows measurement results of a LSTD density reduction ratio and an oxygen precipitate density relative to a concentration of oxygen solid solution in silicon wafer in Example 1-3.

FIG. 8 shows measurement results of an LSTD density reduction ratio and an oxygen precipitate density relative to a concentration of oxygen solid solution in the silicon wafer obtained in Example 1-3.

In FIG. 8, a concentration ($\times 10^{18}$ atoms/cm$^3$) of oxygen solid solution is plotted on the abscissa, an LSTD density reduction ratio (%) is plotted on the first ordinate (ordinate on the left side of paper), and an oxygen precipitate density (/cm$^3$) is plotted on the second ordinate (ordinate on the right side of paper). In FIG. 8, points plotted with a solid circle correspond to an LSTD density reduction ratio at 1300° C. relative to each concentration of oxygen solid solution, those plotted with a solid square correspond to an LSTD density reduction ratio at 1350° C. relative to each concentration of solid oxygen solution, those plotted with a blank circle correspond to an oxygen precipitate density at 1300° C. relative to each concentration of oxygen solid solution, and those plotted with a blank square correspond to an oxygen precipitate density at 1350° C. relative to each concentration of oxygen solid solution.

From FIG. 8, it can be confirmed that the LSTD reduction ratio tends to decrease with an increase in the concentration of solid oxygen solution in the silicon wafer. In particular, this tendency is marked when the concentration of oxygen solid solution exceeds $1.3 \times 10^{18}$ atoms/cm$^3$, since an inner-wall oxide film of COP does not easily disappear because of oxygen contained much in the silicon wafer. When the concentration of oxygen solid solution in the silicon wafer is small, on the other hand, the number of oxygen precipitation nuclei decreases and a precipitation density is therefore presumed to reduce after the rapid heating/cooling thermal process or oxygen precipitation heat treatment. In particular, as illustrated in FIG. 8, this tendency is marked when the concentration of oxygen solid solution is less than $0.5 \times 10^{18}$ atoms/cm$^3$.

As is apparent from FIG. 8, with an increase in the concentration of oxygen solid solution in the silicon wafer, the oxygen precipitate density tends to increase. At the concentration of oxygen solid solution of $0.7 \times 10^{18}$ atoms/cm$^3$ or more, its increasing tendency becomes uniform. From the standpoint of the oxygen precipitate density, the concentration of oxygen solid solution in the silicon wafer is preferably $0.7 \times 10^{18}$ atoms/cm$^3$ or more.

Thus, the LSTD density reduction ratio is relatively high and the oxygen precipitate density is high when the concentration of oxygen solid solution in the silicon wafer falls within a range of $0.5 \times 10^{18}$ atoms/cm$^3$ to $1.3 \times 10^{18}$ atoms/cm$^3$, more preferably within a range of $0.7 \times 10^{18}$ atoms/cm$^3$ to $1.3 \times 10^{18}$ atoms/cm$^3$. It is therefore preferred to control the concentration to fall within the above-described range to give a relatively high LSTD density reduction ratio and a high oxygen precipitate density.

EXAMPLE 1-4

Samples of the silicon wafers obtained in Example 1-1 and subjected to rapid heating/cooling thermal process at an oxygen partial pressure of from 20% to 100% and RTP temperatures at 1300° C., 1330° C., 1350° C., and 1380° C., respectively were subjected to oxygen precipitation heat treatment as described in Example 1-3 (heat treatment at 800° C. for 4 hours in a 100% oxygen gas atmosphere, followed by heat treatment at 1000° C. for 16 hours in the same gas atmosphere (100% oxygen gas)). The samples thus obtained were evaluated for oxygen precipitate density as evaluation in Example 1-4. Evaluation of the oxygen precipitate density was performed in a region within 50 μm from the wafer surface by using "BMD Analyzer System MO411" (trade name; product of Raytex Corporation). The oxygen precipitation heat treatment was performed as heat treatment typically performed in the device process.

In Comparative Example 1-1, a comparative example of Example 1-4, the samples of the silicon wafers obtained in Example 1-1 by rapid heating/cooling thermal process at oxygen partial pressures of 0% and 10% and RTP temperatures of 1300° C., 1330° C., 1350° C., and 1380° C. were subjected to similar oxygen precipitation heat treatment and the resulting samples were evaluated for oxygen precipitate density.

As a result, it has been found that the lower the oxygen partial pressure and the lower the RTP temperature, the higher the oxygen precipitate density. In short, the samples obtained in Comparative Example 1-1 had a higher oxygen precipitate density than that of the samples obtained in Example 1-4. This result is presumed to occur because with an increase in both the oxygen partial pressure and the RTP temperature, the interstitial silicon concentration increases, which raises the supersaturation degree and suppresses oxygen precipitation caused by oxygen precipitation heat treatment.

The results so far described suggest that in the silicon wafers produced using the production process of a silicon wafer according to the invention, it is possible to prevent re-precipitation of an oxygen solid solution in the DZ layer which will otherwise occur by the heat treatment (for example, heat treatment in the device process) after the rapid heating/cooling thermal process.

Figure 9:
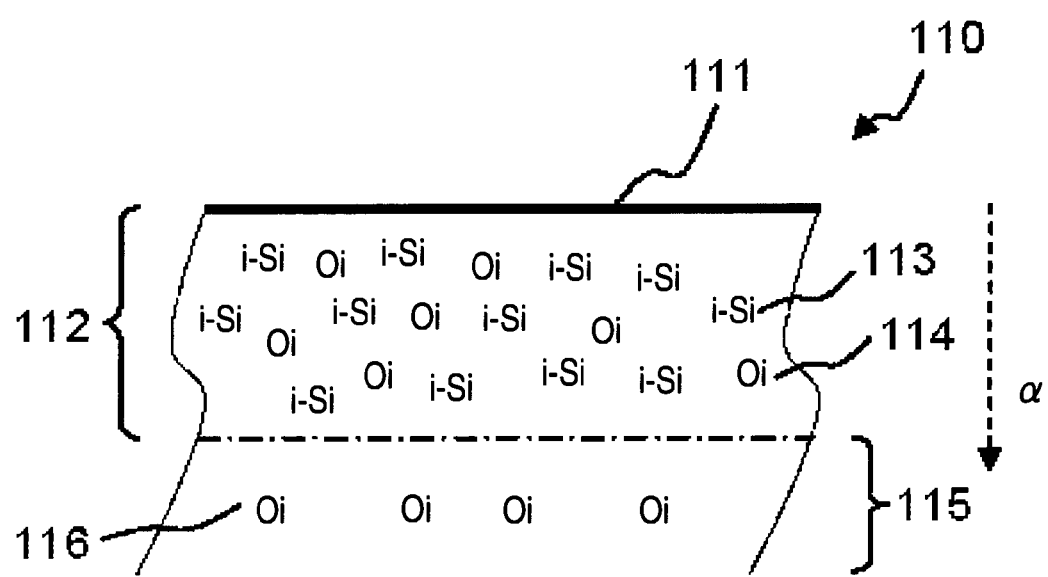
FIG. 9 is a schematic cross-sectional view of a silicon wafer relating to a second embodiment.

A second embodiment of the invention will hereinafter be described referring to FIG. 9. FIG. 9 is a schematic cross-sectional view illustrating a silicon wafer of the second embodiment. The "concentration of oxygen solid solution" as used herein means a value determined from a conversion factor based on Old ASTM of 1970-1979 Edition.

As illustrated in FIG. 9, the silicon wafer according to the second embodiment contains, in a defect-free region (a region free from BMD or grown-in defects (including dislocation clusters): Denuded Zone; which will hereinafter be called "DZ layer") 12 of a silicon wafer 10 containing at least a device active region, interstitial silicon (Interstitial-Si which is indicated "i-Si" in FIG. 9) 13 in supersaturated state.

What is meant by the interstitial silicon contained in supersaturated state is that when the surface of a silicon wafer subjected to Sato etching after two-stage heat treatment (heat treatment at 800° C. for 4 hours in a 100% oxygen atmosphere, followed by heat treatment at 1000° C. for 16 hours in the same atmosphere (100% oxygen)) is observed with a microscope and the number of etch pits present in a region within 5 μm from the surface are counted, the etch pit density is not more than 10 pieces/cm$^2$.

The silicon wafer has the DZ layer 12 from the surface 11 thereof to a depth almost equal to that of the device active region or deeper. The DZ layer 12 has a thickness of, for example, about 5 μm.

The DZ layer 12 is equipped with a high oxygen concentration region having a concentration of oxygen solid solution as high as $0.7 \times 10^{18}$ atoms/cm$^3$ or more.

Thus, the silicon wafer according to the invention contains, in the DZ layer 12 thereof, interstitial silicon in supersaturated state and at the same time has a high oxygen concentration region having a concentration of oxygen solid solution of $0.7 \times 10^{18}$ atoms/cm$^3$ or more so that it is denuded of grown-in defects, has a high gettering effect, can prevent precipitation of BMD in the device active region, and can have improved thermal strength in its device active region.

Even if interstitial silicon is contained in the DZ layer 12 in supersaturated state, the silicon wafer cannot have improved thermal strength in the device active region thereof when the concentration of oxygen solid solution is less than $0.7 \times 10^{18}$ atoms/cm$^3$.

Even if the concentration of oxygen solid solution is $0.7 \times 10^{18}$ atoms/cm$^3$ or more, an oxygen solid solution is undesirably precipitated as BMD in the DZ layer 12 when the interstitial silicon is not contained in the DZ layer 12 in supersaturated state.

In a bulk region 15 present in a deeper portion of the silicon wafer 10 than the DZ layer 12, on the other hand, agglomerates of supersaturated vacancy-type point defects of COP and LSTD or oxygen precipitates may remain without problems.

A manufacturing method of a silicon wafer according to the second embodiment will hereinafter be described.

In order to produce the silicon wafer according to the second embodiment, first, a concentration of oxygen solid solution is adjusted to approximately $0.7 \times 10^{18}$ atoms/cm$^3$ or $0.7 \times 10^{18}$ atoms/cm$^3$ or more upon growth of a silicon single crystal ingot by the Czochralski process.

Described specifically, polycrystalline silicon filled in a quartz crucible in a furnace is heated into a silicon melt. A seed crystal is brought into contact with the silicon melt downwards to the liquid surface thereof and the resulting seed crystal is pulled up while rotating the seed crystal and the crucible. The diameter of the crystal is extended into a desired diameter and a straight cylindrical portion is grown, whereby a silicon single crystal ingot is prepared. The concentration of oxygen solid solution can be adjusted by controlling the rotation number of the quartz crucible or pressure in the furnace.

Then, the silicon single crystal ingot thus obtained is processed into a silicon wafer in a known manner as in the first embodiment.

The silicon wafer produced above is subjected to a rapid heating/cooling thermal process (RTP: Rapid Thermal Process) at a temperature of 1,300° C. to 1,380° C. in an oxidizing gas atmosphere having an oxygen partial pressure of 20% to 100%.

The silicon wafer having a concentration of oxygen solid solution of around $0.7 \times 10^{18}$ atoms/cm$^3$ or $0.7 \times 10^{18}$ atoms/cm$^3$ or more is then subjected to rapid heating/cooling thermal process to incorporate, in the defect-free region, interstitial silicon in a supersaturated state.

Examples of a temperature process usable for the rapid heating/cooling thermal process include a process of raising the temperature to a maximum retention temperature $T_1$ at a rate of 10° C./sec or more in an oxidizing gas atmosphere such as oxygen, keeping the temperature at the maximum retention temperature $T_1$ for a desired time (for example, from 1 sec to 60 sec), and then reducing the temperature at a rate of 10° C./sec or more (FIG. 10A); a process of raising the temperature to a maximum retention temperature $T_1$ at the above-described rate in a non-oxidizing gas atmosphere such as argon, changing the atmosphere to an oxidizing gas atmosphere such as oxygen gas during retention at the maximum retention temperature $T_1$ and keeping the condition for a desired period of time further, and reducing the temperature at the above-described rate (FIG. 10B); and a process of raising the temperature to a maximum retention temperature $T_2$ in a non-oxidizing gas atmosphere such as argon, reducing the temperature to a maximum retention temperature $T_3$ ($<T_2$), changing the atmosphere to an oxidizing gas atmosphere such as oxygen gas during the temperature reduction, and then raising the temperature to the maximum retention temperature $T_1$ ($<T_2$) again (FIG. 10C).

The second embodiment is similar to the first embodiment in the mechanism that by the rapid heating/cooling thermal process, the DZ layer is formed and at the same time, it is supersaturated with interstitial silicon.

Figure 11A:
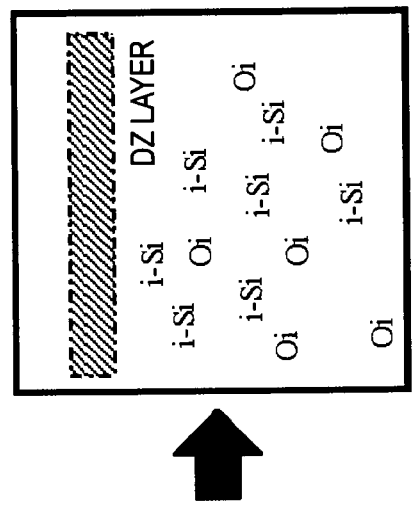
FIGS. 11A to 11C are conceptual views for describing a mechanism where by a rapid heating/cooling thermal process, a DZ layer is formed and the interstitial silicon enters a supersaturated state.
Figure 11B:
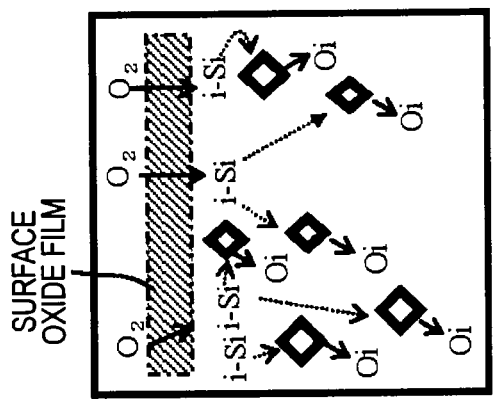
Figure 11C:
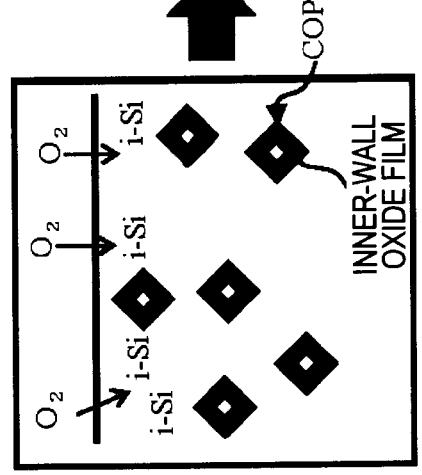

FIG. 11A to 11C are conceptual views for describing the mechanism where by the rapid heating/cooling thermal process, a DZ layer is formed and at the same time, the interstitial silicon enters a supersaturated state.

In the above-described rapid heating/cooling thermal process, when an abrupt temperature rise by the rapid heating/cooling thermal process occurs in a high oxygen concentration state having an oxygen partial pressure of 20% or more, the silicon wafer surface is oxidized and interstitial silicon (i-Si) is thereby produced and introduced (FIG. 11A). Subsequently, the oxygen contained in the inner wall oxide film formed on the inner wall of COP produced at the growth of a silicon single crystal ingot melts into the silicon wafer during the high-temperature treatment. The i-Si produced above is filled in COP from which the inner wall oxide film is removed, as a result, COP disappears (FIG. 11B) and a defect-free region (DZ layer) is formed (FIG. 11C). At this time, after COP disappears, the remaining interstitial silicon (i-Si) forms a supersaturated state of interstitial silicon in the defect-free region above (FIG. 11C).

Figure 12A:
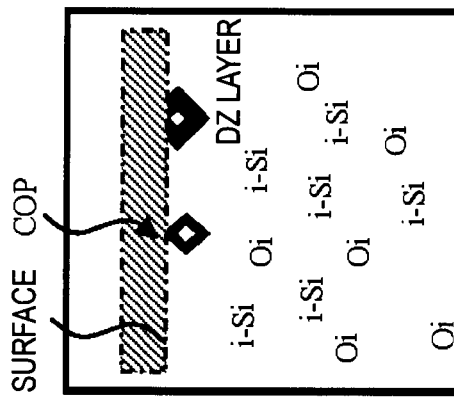
FIGS. 12A to 12C are conceptual views for describing a mechanism where in the mechanism of forming a DZ layer and creating a supersaturated state of interstitial silicon by the rapid heating/cooling thermal process, COP remains in the vicinity of the wafer surface.
Figure 12B:
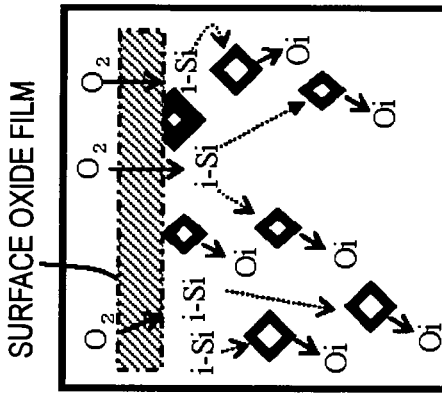
Figure 12C:
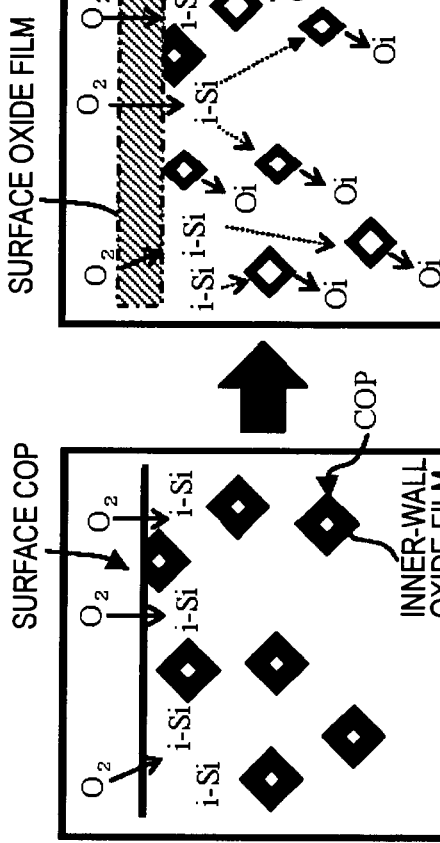

Incidentally, COP sometimes remains in the vicinity of the wafer surface after the rapid heating/cooling thermal process. FIG. 12A to 12C are conceptual views for describing the mechanism where in the mechanism of forming a DZ layer and creating a supersaturated state of interstitial silicon by the rapid heating/cooling thermal process, COP remains in the vicinity of the wafer surface.

Here, examples of the case of allowing COP to remain in the vicinity of the wafer surface include a case where the concentration of solid-solution oxygen is very high (for example, $1.7 \times 10^{18}$ atoms/cm$^3$ or more) at the growth of a silicon single crystal ingot obtained by a Czochralski method, and a case where the oxygen partial pressure in the oxidizing atmosphere at the rapid heating/cooling thermal process is high (for example, atmosphere of 100% oxygen).

For example, when the concentration of solid-solution oxygen at the growth of a silicon single crystal ingot is high or when the oxygen partial pressure in the oxidizing atmosphere at the rapid heating/cooling thermal process is high, oxygen enters a supersaturated state in the vicinity of the wafer surface and therefore, oxygen contained in the inner wall oxide film formed on the inner wall of COP produced in the vicinity of surface scarcely melts into the wafer. Accordingly, the inner wall oxide film of COP formed in the vicinity of wafer surface comes to remain, and the remaining inner wall oxide film prevents i-Si from being filled in the inside of COP. For this reason, COP near the surface cannot be eliminated in some cases (FIGS. 12A to 12C).

In this case, a defect-free region (DZ layer) where the interstitial silicon is in a supersaturated state can be formed by polishing the wafer to remove COP remaining in the vicinity of the wafer surface. Here, the polishing may be performed only by finish polishing that is a generally well-known technique, or by using secondary polishing that is a well-known technique, and the finish polishing above in combination.

In the silicon wafer 10 of the second embodiment, distribution of the concentration of oxygen solid solution in a depth direction inside the silicon wafer 10 from the surface thereof will next be described referring to FIGS. 11 to 13.

Figure 13:
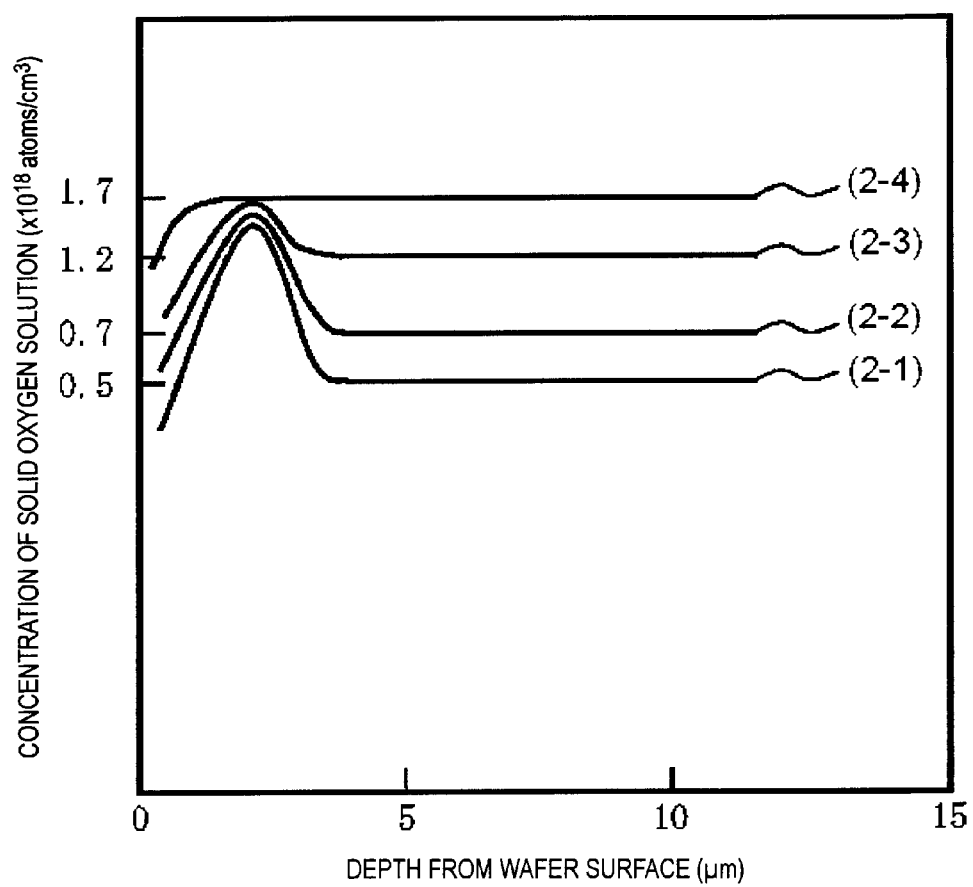
FIG. 13 is a graph illustrating a depth-direction distribution of a concentration of oxygen solid solution in the silicon wafer according to the second embodiment.

FIGS. 11 to 13 are graphs showing the depth-direction distribution of a concentration of oxygen solid solution in the silicon wafer of this embodiment. In FIGS. 11 to 13, depth (μm) from the surface of silicon wafer is plotted on the abscissa, while a concentration ($\times 10^{18}$ atoms/cm$^3$) of oxygen solid solution is plotted on the ordinate. FIG. 11 shows a depth-direction distribution of a concentration of oxygen solid solution when the interstitial silicon is contained in supersaturated state as in the above-described case of FIGS. 3A to 3C; FIG. 12 shows a depth-direction distribution of a concentration of oxygen solid solution when the interstitial silicon is contained in supersaturated state and COP is removed from the surface by polishing as in the above-described case of FIGS. 4A to 4C; and FIG. 13 shows a depth-direction distribution of a concentration of oxygen solid solution when the polishing amount is more than that of FIG. 12.

The depth-direction distribution of a concentration of oxygen solid solution of the second embodiment includes three modes: the first mode is that the silicon wafer has, in a defect-free region thereof (for example, a region within a depth of 5 μm from the wafer surface) containing at least a device active region, a high oxygen concentration region having a maximum concentration of oxygen solid solution of $0.7 \times 10^{18}$ atoms/cm$^3$ or more and at the same time has a bulk region, in a region of the silicon wafer deeper than the defect-free region (for example, a region deeper than 5 μm from the wafer surface), having a concentration of oxygen solid solution of $0.7 \times 10^{18}$ atoms/cm$^3$ or more (FIG. 11(2) and FIG. 11(3), FIG. 12(6) and FIG. 12(7), which mode will hereinafter be called "first mode"); the second mode is similar to the first mode except the bulk region has a concentration of oxygen solid solution less than $0.7 \times 10^{18}$ atoms/cm$^3$ (FIG. 11(1) and FIG. 12(5), which mode will hereinafter be called "second mode"); and the remaining mode is that the concentration of oxygen solid solution does not have a peak value (maximum value) of $0.7 \times 10^{18}$ atoms/cm$^3$ or more but the concentration of oxygen solid solution in the defect-free region and the bulk region is $0.7 \times 10^{18}$ atoms/cm$^3$ or more (FIG. 11(4), FIG. 12(8), and FIG. 13(9) to FIG. 13(11)).

The silicon wafer is preferably equipped with the mode (FIG. 11(1) to FIG. 11(3) and FIG. 12(5) to FIG. 12(7)) in which the concentration of oxygen solid solution in the defect-free region is higher than that in the bulk region deeper inside the silicon wafer than the defect-free region.

The silicon wafer having such a constitution can pin the BMD which has appeared in the bulk region or slip dislocation which has appeared from the backside of the wafer and therefore, propagation of them to a device formation region in the wafer surface can be prevented.

The silicon wafer more preferably has the modes (FIG. 11(1) to FIG. 11(4) and FIG. 12(8)) in which the concentration of oxygen solid solution shows a gradual decrease from the high oxygen concentration region toward the surface of the silicon wafer.

The silicon wafer having such a constitution can suppress an amount of thermal donors formed in the surface.

EXAMPLE 2

Advantages of the second embodiment of the invention will hereinafter be described based on Examples 2-1 to 2-11, but the invention is not limited to or by Examples 2-1 to 2-11.

EXAMPLES 2-1 to 2-11

Three silicon single crystal ingots having a P type and a crystal plane direction (001) and different in [Oi] were produced by pulling so as to form a vacancy-type point defect region (I region) having an agglomerate of vacancy type point defects therein across the surface while adjusting a concentration of oxygen solid solution to 0.5, 0.7, 1.2, and 1.7 ($\times 10^{18}$ atoms/cm$^3$) (calculated using a conversion factor according to Old ASTM of 1970 to 1979 Edition) and controlling V/G (in which V represents a pull rate and G represents a temperature gradient at 1300° C. in a crystal axis direction) upon production of silicon single crystal ingots by the CZ process.

A double-side polished silicon wafer having a diameter of 300 mm was produced by slicing each of the silicon single crystal ingots into a wafer form by using a wire saw, and then subjecting it to beveling, lapping, etching, and polishing.

Then, a rapid heating/cooling thermal process was performed with an RTP apparatus 10 as illustrated in FIG. 2 in accordance with a temperature process as shown in FIG. 10A in a 100% oxygen atmosphere under the following conditions: temperature raising rate of 75° C./sec, maximum operating temperature of 1300° C., retention time of 30 sec at the maximum operating temperature, and temperature reducing rate of 25° C./sec to produce four silicon wafers, that is, a silicon wafer (Example 2-1: concentration of oxygen solid solution of $0.5 \times 10^{18}$ atoms/cm$^3$) having an oxygen concentration distribution as illustrated in FIG. 11(1); a silicon wafer (Example 2-2: concentration of oxygen solid solution of $0.7 \times 10^{18}$ atoms/cm$^3$) having an oxygen concentration distribution as illustrated in FIG. 11(2); a silicon wafer (Example 2-3: concentration of oxygen solid solution of $1.2 \times 10^{18}$ atoms/cm$^3$) having an oxygen concentration distribution as illustrated in FIG. 11(3); and a silicon wafer (Example 2-4: concentration of oxygen solid solution of $1.7 \times 018$ atoms/cm$^3$) having an oxygen concentration distribution as illustrated in FIG. 11(4).

In addition, the samples obtained from lots similar to those obtained in Examples 2-1 to 2-4 subjected to the rapid heating/cooling thermal process were subjected to surface polishing with an allowance of about 2.5 μm from the surface to obtain a silicon wafer (Example 2-5; concentration of oxygen solid solution of $0.5 \times 10^{18}$ atoms/cm$^3$) having an oxygen concentration distribution as illustrated in FIG. 12(5), a silicon wafer (Example 2-6: concentration of oxygen solid solution of $0.7 \times 10^{18}$ atoms/cm$^3$) having an oxygen concentration distribution as illustrated in FIG. 12(6), a silicon wafer (Example 2-7: concentration of oxygen solid solution of $1.2 \times 10^{18}$ atoms/cm$^3$) having an oxygen concentration distribution as illustrated in FIG. 12(7), and a silicon wafer (Example 2-8: concentration of oxygen solid solution of $1.7 \times 10^{18}$ atoms/cm$^3$) having an oxygen concentration distribution as illustrated in FIG. 12(8).

Further, the samples obtained from lots similar to those obtained in Examples 2-2 to 2-4 subjected to the rapid heating/cooling thermal process were subjected to surface polishing with an allowance of about 5.0 μm from the surface to obtain a silicon wafer (Example 2-9; concentration of oxygen solid solution of $0.7 \times 10^{18}$ atoms/cm$^3$) having an oxygen concentration distribution as illustrated in FIG. 13(9), a silicon wafer (Example 2-10: concentration of oxygen solid solution of $1.2 \times 10^{18}$ atoms/cm$^3$) having an oxygen concentration distribution as illustrated in FIG. 13(10), and a silicon wafer (Example 2-11: concentration of oxygen solid solution of $1.7 \times 10^{18}$ atoms/cm$^3$) having an oxygen concentration distribution as illustrated in FIG. 13(11).

COMPARATIVE EXAMPLES 2-1 and 2-2

Figure 14:
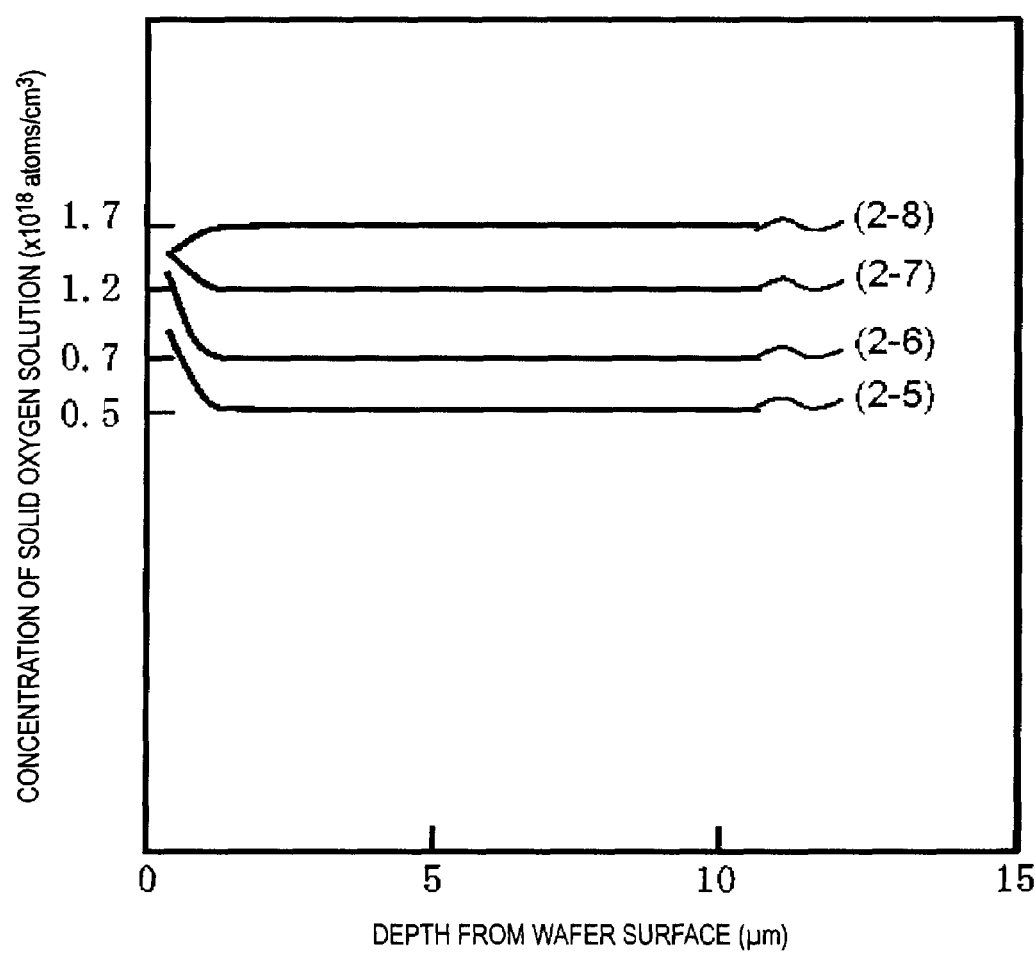
FIG. 14 is a graph illustrating a depth-direction distribution of a concentration of oxygen solid solution in the silicon wafer according to the second embodiment.
Figure 15:
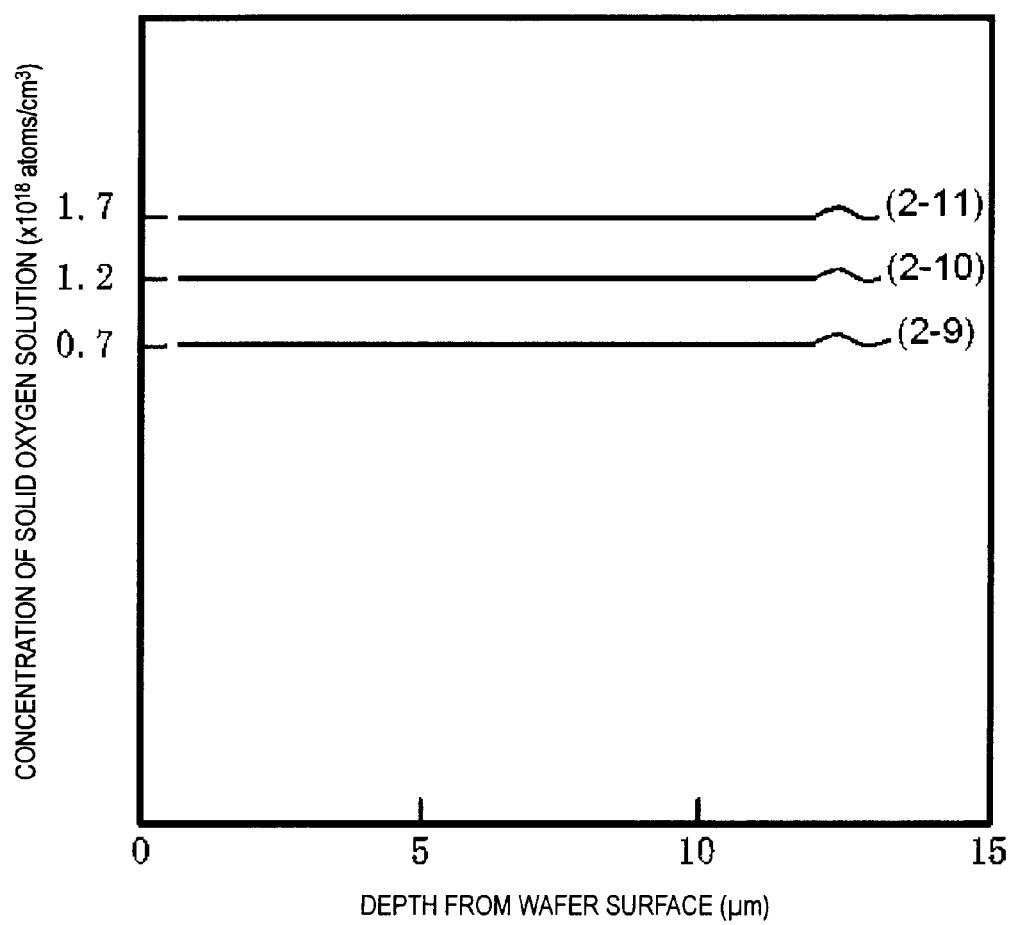
FIG. 15 is a graph illustrating a depth-direction distribution of a concentration of oxygen solid solution in the silicon wafer according to the second embodiment.
Figure 16:
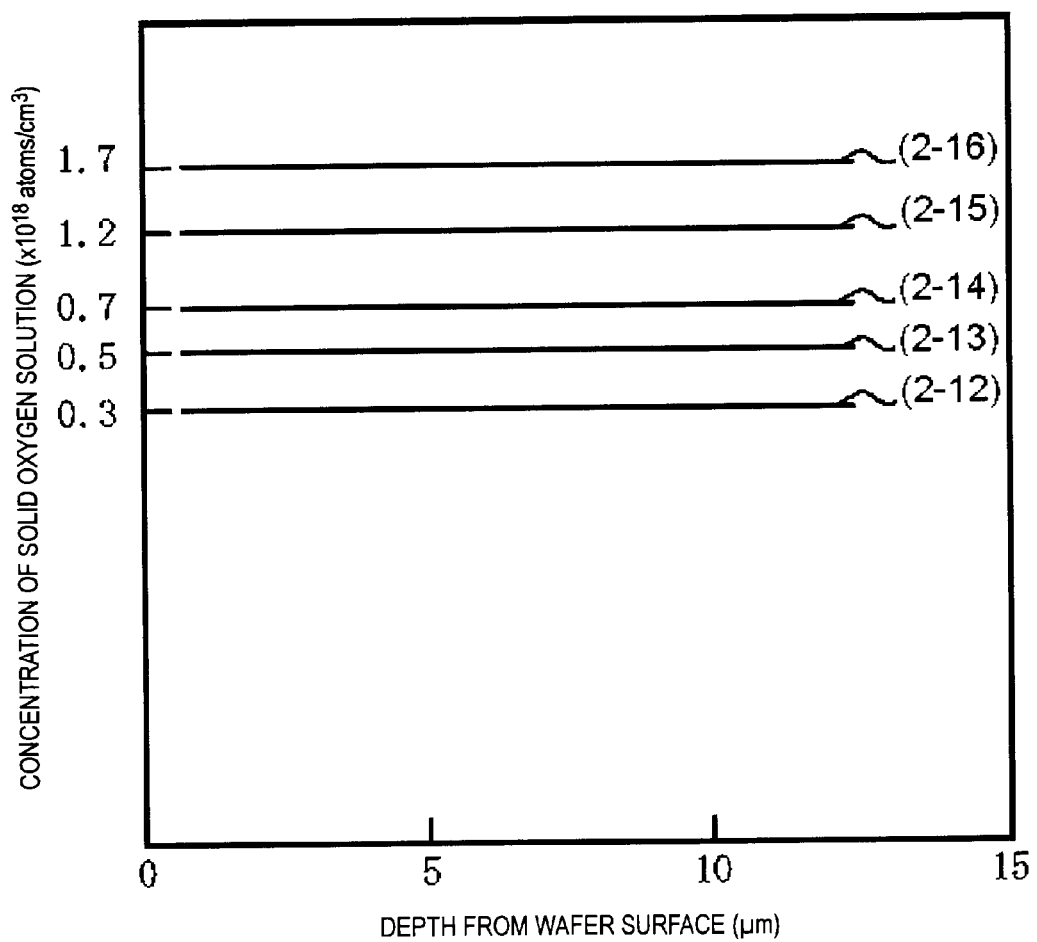
FIG. 16 is a graph illustrating a depth-direction distribution of a concentration of oxygen solid solution in the silicon wafers obtained in Comparative Examples 2-1 to 2-5.

In a similar manner (RTP+surface polishing with an allowance of about 5.0 μm) to Examples 2-9 to 2-11 except that a concentration of oxygen solid solution was adjusted to 0.3 and 0.5 ($\times 10^{18}$ atoms/cm$^3$), a silicon wafer (Comparative Example 2-1; concentration of oxygen solid solution of $0.3 \times 10^{18}$ atoms/cm$^3$) having an oxygen concentration distribution as illustrated in FIG. 14(12) and a silicon wafer (Comparative Example 2-2: concentration of oxygen solid solution of $0.5 \times 10^{18}$ atoms/cm$^3$) having an oxygen concentration distribution as illustrated in FIG. 14(13) were obtained, respectively.

COMPARATIVE EXAMPLES 2-3 to 2-5

A plurality of silicon single crystal ingots having a P type and a crystal plane direction (001) and different in concentration of oxygen solid solution was produced by pulling so as to form, across the surface, a detect-free region having no agglomerate of vacancy type point defects and rich in interstitial silicon type point defects while adjusting a concentration of oxygen solid solution to 0.7, 1.2, and 1.7 ($\times 10^{18}$ atoms/cm$^3$) (calculated using a conversion factor according to Old ASTM of 1970 to 1979 Edition) and controlling V/G (in which V represents a pull rate and G represents a temperature gradient at 1300° C. in a crystal axis direction) upon production of the silicon single crystal ingots by the CZ process.

The silicon single crystal ingots thus obtained were sliced in a wafer form by a wire saw and subjected to bevel processing, lapping, etching, and polishing to produce double-side polished silicon wafers having a diameter of 300 mm. As a result, a silicon wafer (Comparative Example 2-3; concentration of oxygen solid solution of $0.7 \times 10^{18}$ atoms/cm$^3$) having an oxygen concentration distribution as illustrated in FIG. 14(14), a silicon wafer (Comparative Example 2-4: concentration of oxygen solid solution of $1.2 \times 10^{18}$ atoms/cm$^3$) having an oxygen concentration distribution as illustrated in FIG. 14(15), and a silicon wafer (Comparative Example 2-5: concentration of oxygen solid solution of $1.7 \times 10^8$ atoms/cm$^3$) having an oxygen concentration distribution as illustrated in FIG. 14(16) were obtained, respectively.

(Evaluation of Oxygen Precipitate Density)

The samples obtained in Examples 2-1 to 2-11 and Comparative Examples 2-1 to 2-5 were heat treated at 800° C. for 4 hours in a 100% oxygen atmosphere, followed by heat treatment at 1000° C. for 16 hours in the same atmosphere (100% oxygen). Then, the resulting samples were subjected to Sato etching (etchant composition; HF (concentration: 49%):HNO3 (concentration: 69%):CH$_3$COOH:H$_2$O=1:15:3:1). The surface of the samples was observed with a microscope and the density of etch pits present in a region within 5 μm from the surface was measured.

As a result, the samples obtained in Examples 2-1 to 2-11 and Comparative Examples 2-1 and 2-2 had an etch pit density of 10 pieces/cm$^2$ or less and thus, etch pits were hardly observed. The samples obtained in Comparative Examples 2-3 to 2-5, on the other hand, had an oxygen precipitate density exceeding 10 pieces/cm$^2$ and they were found to have many etch pits.

(Evaluation of Slip)

The samples obtained in Examples 2-1 to 2-11 and Comparative Examples 2-1 to 2-5 were exposed to severer conditions (heat treatment at 1200° C. for 1 hour in a 100% oxygen atmosphere) than those employed in the evaluation of the oxygen precipitate density. Generation of slip dislocations in a defect-free region of each sample which will be a device formation surface was evaluated.

As a result, with regard to the samples obtained in Comparative Examples 2-1 and 2-2, propagation of slip from the backside of the wafer to the device formation region of the wafer surface was confirmed, while with regard to the other samples, such propagation of slip was not confirmed.

A third embodiment is described in detail below by referring to FIG. 17.

In the method for heat-treating a silicon wafer according to the third embodiment, a wafer obtained by slicing a silicon single crystal ingot produced by a CZ method is subjected to RTP. The third embodiment is characterized in that at the RTP, the maximum achievable temperature is set to a temperature between 1,300° C. and the melting point of silicon and the atmosphere in the holding state at the maximum achievable temperature is set to an oxidizing gas atmosphere having an oxygen partial pressure of 20% to 100% on the surface side of the wafer and to a non-oxidizing gas atmosphere on the back side of the wafer.

As described above, RTP is performed in an oxygen atmosphere on the wafer surface, whereby interstitial silicon is produced along the oxidation reaction and fills a void defect (COP) present in the wafer.

On the other hand, the atmosphere on the back side of the wafer is set to a non-oxidizing gas atmosphere, whereby the vacancy concentration tends to become high and the concentration of vacancies remaining in the bulk after cooling can be raised.

Accordingly, on the wafer surface side, a DZ layer is formed and at the same time, the concentration of solid-solution oxygen becomes high, whereas on the wafer back side, the concentration of residual vacancy is raised.

As a result, in the heat treatment later, a high-density BMD can be formed in the bulk of the wafer.

In the above-described heat treatment method of a silicon wafer, the atmosphere on the wafer surface side in RTP is preferably set to a non-oxidizing gas atmosphere in the temperature rise process and after reaching the maximum achievable temperature, switched to an oxidizing gas atmosphere having an oxygen partial pressure of 20% to 100%.

By such switching of the atmosphere gas, COP on the surface side can be more completely eliminated and the DZ layer can be formed with higher quality.

At the switching from a non-oxidizing atmosphere to an oxidizing atmosphere, the temperature is preferably once lowered to 1,000° C. or less.

By switching the atmosphere to an oxidizing atmosphere at 1,000° C. or less, the surface roughness can be prevented from deteriorating due to an abrupt oxidation reaction.

Also, in the temperature drop process in RTP, both the surface side and the back side of the wafer are preferably set to a non-oxidizing gas atmosphere.

By this control, the region for precipitation of oxygen in the heat treatment later can be brought close to the wafer surface side. That is, the thickness of the DZ layer can be made thin, whereby the production region for oxygen precipitate can come close to the device formation region and the impurity gettering effect can be enhanced.

Furthermore, the flow rate of an oxidizing gas supplied to create an oxidizing gas atmosphere on the surface side of the wafer is preferably smaller than the flow rate of a non-oxidizing gas supplied to create a non-oxidizing gas atmosphere on the back side of the wafer.

By adjusting the flow rate of the supply gas in this way, the non-oxidizing gas on the wafer back side can be prevented from flowing into the surface side through the outer peripheral part of the wafer and an oxidation reaction on the wafer surface by the oxidizing atmosphere can be allowed to uniformly proceed in the plane. That is, on the wafer surface side, a high-quality DZ layer can be formed also in the outer peripheral part.

Furthermore, the oxidizing gas is prevented from flowing into the back side, whereby BMD can be uniformly formed also in the outer peripheral part on the back side.

Figure 17:
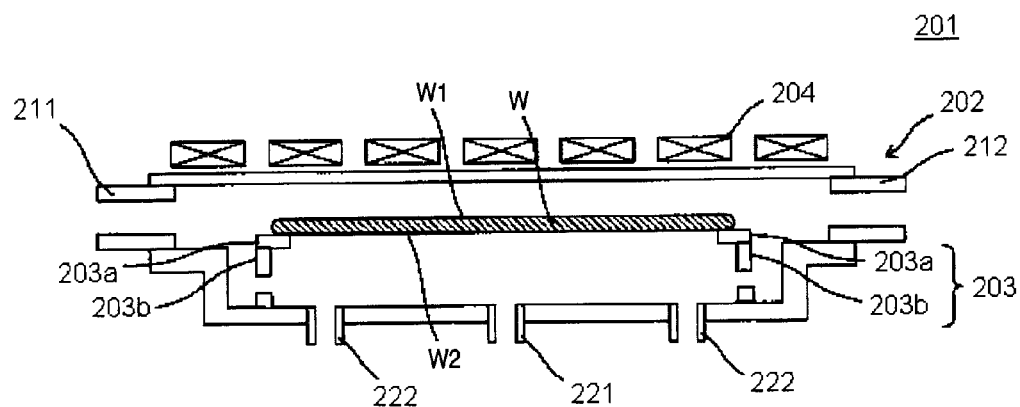
FIG. 17 is a cross-sectional view showing the outline of the chamber part of a wafer heat-treating apparatus used in the heat treatment method for a silicon wafer according to a third embodiment.

The above-described RTP according to the third embodiment can be suitably performed, for example, by an apparatus shown in FIG. 17.

FIG. 17 shows the outline of the chamber part of a wafer heat-treating apparatus used in the heat treatment method for a silicon wafer according to the third embodiment.

The wafer heat-treating apparatus shown in FIG. 17 is an RTP apparatus, where the chamber part 201 comprises a reaction tube 202 for housing a wafer W, a wafer supporting part 203 disposed inside of the reaction tube 202, and a plurality of lamps 204 that irradiate light to heat the wafer W. The wafer W is put on the wafer supporting part 203.

The reaction tube 202 comprises a gas supply port 211 and a gas discharge port 212 for supplying the atmosphere gas on the surface W1 side of the wafer W and also comprises a gas supply port 221 and a gas discharge port 222 for supplying the atmosphere gas on the back W2 side of the wafer W.

RTP of a silicon wafer by using the wafer heat-treating apparatus shown in FIG. 17 is described below.

A wafer W is put and supported on a susceptor 203a of the wafer supporting part 203 in the reaction tube 202 and while rotating the susceptor 203a by a susceptor rotation part 203b, an oxidizing gas having an oxygen partial pressure of 20% to 100% or a non-oxidizing gas is supplied from the gas supply port 211 to the surface W1 side of the wafer W in the reaction tube 202. On the other hand, from the gas supply port 221, a non-oxidizing gas is supplied to the back W2 side of the wafer W in the reaction tube 202.

While thus supplying predetermined gases into the reaction tube 202 from both of the gas supply ports 211 and 221, the wafer W is heated by light irradiation from the lamp 204. This process is a temperature rise process.

After the wafer W reaches a predetermined maximum achievable temperature, the supply gas from the gas supply port 211 is set to an oxidizing gas atmosphere having an oxygen partial pressure of 20% to 100%. Accordingly, in the case where the supply gas from the gas supply port 211 is a non-oxidizing gas in the temperature rise process, the supply gas is switched to an oxidizing gas atmosphere having an oxygen partial pressure of 20% to 100%. On the other hand, the supply gas from the gas supply port 221 is a non-oxidizing gas as it is.

At this time, both gas flow rates from the gas supply ports 211 and 221 are adjusted such that the flow rate of an oxidizing gas supplied from the gas supply port 211 becomes smaller than the flow rate of a non-oxidizing gas supplied from the gas supply port 221.

In this way, in the holding state at the maximum achievable temperature, the non-oxidizing gas supplied from the gas supply port 221 is prevented from flowing into the surface W1 side of the wafer W, and the surface W1 side of the wafer W is placed in an oxidizing gas atmosphere having an oxygen partial pressure of 20% to 100% while placing the back W2 side of the wafer W in a non-oxidizing gas atmosphere, whereby the surface W1 and the back W2 of the wafer W are held in different gas atmospheres.

After holding the wafer W at the maximum achievable temperature for a predetermined time of approximately from several seconds to several tens of seconds, the power of the lamp 204 is reduced and the wafer W is cooled by supplying a cooling gas from the gas supply ports 211 and 221. In this temperature drop process, a non-oxidizing gas is supplied from both of the gas supply ports 211 and 221.

In the third embodiment, the heat treatment of a silicon wafer is performed through the above-described steps.

Incidentally, the temperature control or gas flow rate control in the reaction tube 202 is performed by a known control unit (not shown).

In the third embodiment, the wafer subjected to RTP is a wafer obtained by slicing a silicon single crystal ingot produced by a CZ method.

The production of a silicon single crystal ingot by a CZ method can be performed by a well-known method. More specifically, polycrystalline silicon filled in a quartz crucible is heated to obtain a silicon melt, a seed crystal is put into contact with the liquid level of the silicon melt, and the seed crystal is pulled while rotating the seed crystal and the quartz crucible and after expanding the size to a desired diameter and forming a straight barrel part, separated from the silicon melt, whereby a silicon single crystal ingot is grown.

Thereafter, the thus-obtained silicon single crystal ingot is processed into a silicon wafer by a well-known method. More specifically, the silicon single crystal ingot is sliced into a wafer shape by an inner diameter blade, a wire saw or the like and then subjected to processing such as chamfering of the outer peripheral part, lapping, etching and mirror polishing.

The maximum achievable temperature in RTP is preferably set to a range from 1,300° C. to the melting point of silicon.

By setting such a temperature condition, the grown-in defect present in the wafer before heat treatment can be completely eliminated. If the maximum achievable temperature exceeds the melting point of silicon, the silicon wafer melts out during the rapid heating/cooling thermal process and this is not preferred.

More preferably, from the standpoint of the apparatus life as the RTP apparatus, the upper limit of the maximum achievable temperature is set to 1,380° C. or less.

Incidentally, the maximum achievable temperature as used herein is based on the average temperature of temperatures at a large number of points on the wafer back side.

In the oxidizing gas, the oxygen partial pressure is preferably set to a range from 20% to 100%.

If the oxygen partial pressure is less than 20%, it is difficult to sufficiently eliminate COP in the wafer surface layer, produce a high-density BMD in the wafer bulk and suppress the generation of a slip.

As regards the non-oxidizing gas and the gas other than oxygen contained in the oxidizing gas, for example, nitrogen, a nitrogen compound gas or an inert gas may be used, but an inert gas is particularly preferred.

In the case of using a nitrogen gas, a nitride film is sometimes formed on the wafer surface in RTP, and an etching step or the like for removing the nitride film may be additionally required.

The hydrogen gas is not preferred because of a danger of explosion by the mixing with oxygen.

As for the inert gas, use of an argon gas is particularly preferred. The argon gas enables performing the RTP without involving formation of other film such as nitride film or causing a chemical reaction or the like.

The temperature rise rate and the temperature drop rate in the RTP both are preferably from 10° C./sec to 150° C./sec.

If the temperature rise rate or the temperature drop rate is less than 10° C./sec, poor productivity results, whereas if it exceeds 150° C./sec, the silicon wafer cannot withstand the excessively rapid temperature change and a slip is readily generated.

The holding time at the maximum achievable temperature is preferably from 1 to 60 seconds.

If the holding time is less than 1 second, it is difficult to attain, for example, reduction of COP or increase of the BMD density.

On the other hand, if the holding time exceeds 60 seconds, not only the productivity is low but also generation of a slip attributable to stress concentration at the wafer supporting portion becomes conspicuous, which is not preferred.

EXAMPLE 3

The third embodiment is described in greater detail below by referring to Example 3, but the third embodiment is not limited to the following Example 3.

With respect to a silicon wafer (diameter: 300 mm, thickness: 775 mm, oxygen concentration: $1.3 \times 10^{18}$ atoms/ml) obtained by slicing a silicon single crystal ingot grown in a V-rich region by a CZ method, RTP was performed in an RTP apparatus shown in FIG. 17 under the conditions of a maximum achievable temperature and an atmosphere for each of Examples 3-1 to 3-6 and Comparative Examples 3-1 to 3-5 shown in Table 1. In all of Examples and Comparative Examples, the holding time at the maximum achievable temperature was set to 15 seconds and the temperature drop rate was set to the same condition.

Incidentally, in Example 3-6, the flow rate of the supply gas to the wafer surface side in the holding state at the maximum achievable temperature was made smaller by 10% than the flow rate of the supply gas to the wafer back side. Except for Example 3-6, the flow rate of the supply gas was the same on both the wafer surface side and the back side.

TABLE 1

| | Maximum Achievable Temperature (° C.) | Temperature Rise Process | | Holding State | | Temperature Drop Process | |
|---|---|---|---|---|---|---|---|
| | | Surface Side | Back Side | Surface Side | Back Side | Surface Side | Back Side |
| Comparative Example 3-1 | 1250 | 20% oxygen | Ar | 20% oxygen | Ar | 20% oxygen | Ar |
| Example 3-1 | 1300 | 20% oxygen | Ar | 20% oxygen | Ar | 20% oxygen | Ar |
| Example 3-2 | 1350 | 20% oxygen | Ar | 20% oxygen | Ar | 20% oxygen | Ar |
| Comparative Example 3-2 | 1300 | 10% oxygen | Ar | 10% oxygen | Ar | 10% oxygen | Ar |
| Comparative Example 3-3 | 1300 | Ar | Ar | Ar | Ar | Ar | Ar |
| Comparative Example 3-4 | 1300 | $NH_3$ | $NH_3$ | $NH_3$ | $NH_3$ | $NH_3$ | $NH_3$ |
| Comparative Example 3-5 | 1300 | 20% oxygen | 20% oxygen | 20% oxygen | 20% oxygen | 20% oxygen | 20% oxygen |
| Example 3-3 | 1300 | 100% oxygen | Ar | 100% oxygen | Ar | 100% oxygen | Ar |
| Example 3-4 | 1300 | Ar | Ar | 20% oxygen | Ar | 20% oxygen | Ar |
| Example 3-5 | 1300 | Ar | Ar | 20% oxygen | Ar | Ar | Ar |
| Example 3-6 | 1300 | Ar | Ar | 20% oxygen | Ar | Ar | Ar |

After RTP, the degree of disappearance of COP to a depth of 5 μm from the wafer surface was evaluated by the detection of LSTD (Laser Scattering Topography Defect). Also, the thickness of the DZ layer from the wafer surface and the precipitate density of BMD after a two-step heat treatment (held at 780° C. for 3 hours and then held at 1,000° C. for 10 hours) were evaluated.

These results are shown together in Table 2.

Incidentally, in Comparative Examples 3-1 to 3-4, the thickness of the DZ layer was less than the lower measurement limit.

TABLE 2

|  | LSTD Density ($cm^2$) | Thickness of DZ Layer (μm) | BMD Density ($/cm^3$) |
|---|---|---|---|
| Comparative Example 3-1 | 89 | — | $5.6 \times 10^8$ |
| Example 3-1 | 21 | 28 | $3.7 \times 10^9$ |
| Example 3-2 | 9 | 85 | $2.1 \times 10^9$ |
| Comparative Example 3-2 | 62 | — | $3.3 \times 10^9$ |
| Comparative Example 3-3 | 92 | — | $1.1 \times 10^9$ |
| Comparative Example 3-4 | 101 | — | $4.9 \times 10^9$ |
| Comparative Example 3-5 | 18 | 34 | $4.4 \times 10^9$ |
| Example 3-3 | 7 | 63 | $1.8 \times 10^9$ |
| Example 3-4 | 1 | 29 | $4.2 \times 10^9$ |
| Example 3-5 | 1 | 28 | $7.7 \times 10^9$ |
| Example 3-6 | 1 | 30 | $6.9 \times 10^9$ |

With respect to the processed wafers of Examples 3-5 and 3-6, the oxygen concentration profile in the depth direction from the wafer surface in each of the wafer center part and the wafer outer peripheral part (the position of 3 mm toward the center direction from the outer periphery) was evaluated by a secondary ion mass spectrometer (SIMS; Ims-6f, manufactured by Cameca).

As a result, in Example 3-5, the oxygen concentration was lower in the wafer outer peripheral part than in the wafer center part, whereas in Example 3-6, both the wafer center part and the wafer outer peripheral part exhibited a nearly the same oxygen concentration profile.

It was recognized from these results that when the flow rate of the supply gas to the wafer surface side in the holding state at the maximum achievable temperature was set to be smaller than the flow rate of the supply gas to the wafer back side and the atmospheres on the wafer surface and back sides were adjusted, an oxidation reaction uniformly proceeded in the plane.

A fourth embodiment is described in detail below by referring to FIGS. 18 to 23.

The method for heat-treating a silicon wafer according to the fourth embodiment is a method of subjecting a silicon wafer obtained by slicing a silicon single crystal ingot produced by a CZ method to RTP, wherein the RTP is performed in an oxygen-containing atmosphere by setting the maximum achievable temperature to a range from 1,300° C. to the melting point of silicon and setting the temperature drop rate from the maximum achievable temperature to a range from 50° C./sec to 145° C./sec.

By performing the heat treatment in such a way, crystal defects such as COP in the wafer surface part working out to a device active region can be eliminated, a high-density BMD in a level of $1.0 \times 10^{10}$ $cm^3$ can be formed in the bulk part, and generation of a slip in the wafer during RTP can be suppressed.

By performing RTP in an oxygen-containing atmosphere as above, a silicon oxide film is formed on the wafer surface. At this time, a large amount of interstitial silicon is produced at the interface between the silicon oxide film and silicon. When the RTP temperature is a high temperature, the interstitial silicon diffuses into the inside of the wafer and fills COP present particularly in the wafer surface part and therefore, crystal defects in the wafer surface part can be eliminated.

Also, since oxygen in injected into the wafer, the concentration of solid-solution oxygen in the wafer surface part can be raised, so that when the thus heat-treated wafer is used in a device process, extension of a dislocation generated by the application of stress or distortion produced in the device process can be suppressed.

Furthermore, the temperature drop rate from the maximum achievable temperature in RTP is set to a high rate and controlled to the range above, so that although the interstitial silicon having a high diffusion rate is out-diffused while suppressing the generation of a slip, the vacancy necessary for the growth of BMD can form a depth region that remains.

Accordingly, the vacancy present in the wafer bulk part can be prevented from being filled by the interstitial silicon and eliminated, and the concentration of vacancies remaining in the bulk part can be raised, as a result, the BMD density in the wafer bulk part can be increased.

In addition, by setting the maximum achievable temperature in RTP to a range from 1,300° C. to the melting point of silicon, the inner wall oxide film of COP present inside of the wafer can be efficiently melted.

Therefore, in the wafer surface part, the ability of eliminating COP by the filling with interstitial silicon can be raised, whereas in the wafer bulk part, many vacancies can be formed and in turn, BMD can be formed at a high density.

Figure 18:
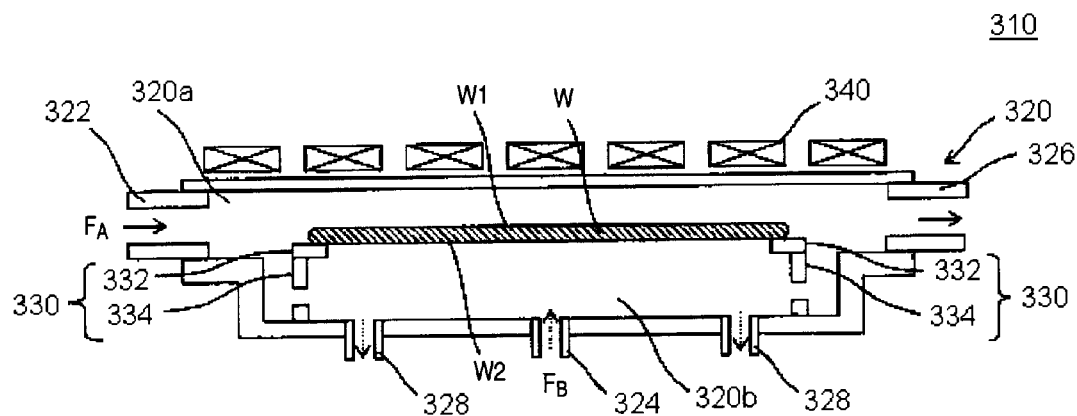
FIG. 18 is a cross-sectional view showing the outline of the chamber part of an RTP apparatus used in the heat treatment method for a silicon wafer according to a fourth embodiment.

The method for heat-treating a silicon wafer according to the fourth embodiment can be suitably performed, for example, by an RTP apparatus shown in FIG. 18.

FIG. 18 is a cross-sectional view showing the outline of the chamber part of an RTP apparatus used in the heat treatment method for a silicon wafer according to the fourth embodiment.

The chamber part 310 of the RTP apparatus shown in FIG. 18 comprises a reaction tube 320 for housing a wafer W, a wafer supporting part 330 disposed inside of the reaction tube 320, and a plurality of lamps 340 that irradiate light to heat the wafer W. The wafer W is put on the wafer supporting part 330.

The reaction tube 320 comprises a gas supply port 322 for supplying a first atmosphere gas $F_A$ (in FIG. 18, indicated by a solid line arrow) to a first space 320a on the surface W1 side of the wafer W, where a semiconductor device is formed, a gas discharge port 326 for discharging the gas from the first space 320a, a gas supply port 324 for supplying a second atmosphere gas $F_B$ (in FIG. 18, indicated by a dotted line arrow) to a second space 320b on the back W2 side of the wafer W, and a gas discharge port 328 for discharging the gas from the second space 320b.

The first atmosphere gas $F_A$ is used as the atmosphere gas during heat treatment of the wafer W in RTP, and the second atmosphere gas $F_B$ is used, if desired, as a cooling gas in RTP. That is, in the present invention, the first atmosphere gas $F_A$ is an oxygen-containing atmosphere gas.

Figure 19:
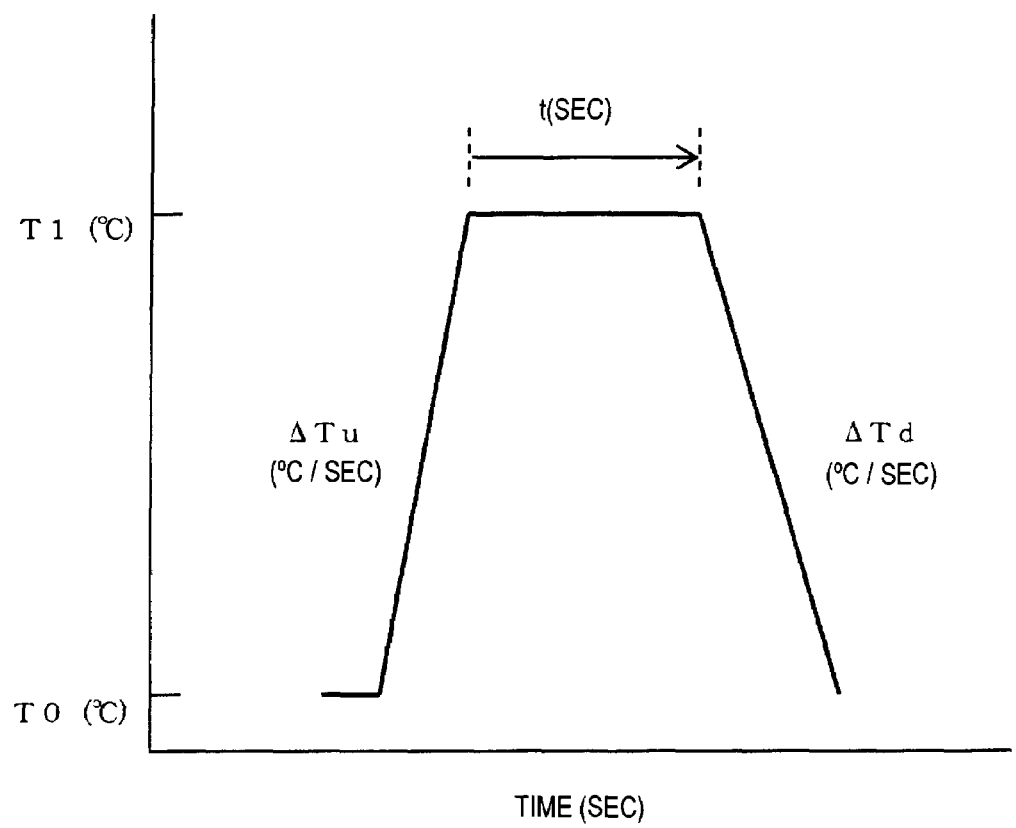
FIG. 19 is a conceptual view for describing one example of the heat treatment sequence in RTP applied to the heat treatment method for a silicon wafer according to the fourth embodiment.

One example of the method for heat-treating a silicon wafer by using the RTP apparatus shown in FIG. 18 is described below. FIG. 19 is a conceptual view for describing one example of the heat treatment sequence in RTP applied to the heat treatment method for a silicon wafer according to the fourth embodiment.

In the heat treatment sequence shown in FIG. 19, the outer peripheral part of the back W2 side of the wafer W is placed and supported on a susceptor 332 of the wafer supporting part 330 inside of the reaction tube 320 kept at a temperature of T0 (for example, 600° C.). Subsequently, the first atmosphere gas $F_A$ is supplied from the gas supply port 322 while discharging the first atmosphere gas $F_A$ from the gas discharge port 326, and light is irradiated from the lamp 340 while rotating the susceptor 334 by a susceptor rotation part 332 to rapidly heat the wafer W to the maximum achievable temperature T1 (° C.) at a predetermined temperature rise rate ΔTu (° C./sec).

The maximum achievable temperature T1 is held for a predetermined time t (sec).

Thereafter, if desired, the second atmosphere gas $F_B$ is supplied from the gas supply port 324 and at the same time, the second atmosphere gas $F_B$ is discharged from the gas discharge port 328, whereby the wafer W is rapidly cooled at a predetermined temperature drop rate ΔTd (° C./sec).

Incidentally, the temperature of the wafer W in the heat treatment sequence is measured, for example, by a radiation thermometer (not shown) disposed below the wafer W. Also, the temperature rise rate and the temperature drop rate are controlled using a control unit (not shown) based on the temperature measured as above, by controlling, for example, the output of individual lamps 340 or the flow rate of the first atmosphere gas $F_A$ or the second atmosphere gas $F_B$.

In the fourth embodiment, the wafer subjected to RTP is a wafer obtained by slicing a silicon single crystal ingot produced by a CZ method.

The production of a silicon single crystal ingot by a CZ method can be performed by a well-known method. More specifically, polycrystalline silicon filled in a quartz crucible is heated to obtain a silicon melt, a seed crystal is put into contact with the liquid level of the silicon melt, and the seed crystal is pulled while rotating the seed crystal and the quartz crucible and after expanding the size to a desired diameter and forming a straight barrel part, separated from the silicon melt, whereby a silicon single crystal ingot is grown.

Thereafter, the thus-obtained silicon single crystal ingot is processed into a silicon wafer by a well-known method. More specifically, the silicon single crystal ingot is sliced into a wafer shape by an inner diameter blade, a wire saw or the like and then subjected to processing such as chamfering of the outer peripheral part, lapping, etching and mirror polishing.

The mirror-polished silicon wafer obtained above is subjected to RTP using an RTP apparatus shown in FIG. 18 in an oxygen-containing atmosphere by setting the maximum achievable temperature to a range from 1,300° C. to the melting point of silicon and setting the temperature drop rate from the maximum achievable temperature to a range from 50 to 145° C./sec.

If the maximum achievable temperature is less than 1,300° C., the ability of eliminating crystal defects such as COP in the wafer surface part working out to a device active region can be hardly raised.

On the other hand, if the maximum achievable temperature exceeds the melting point of silicon, the silicon wafer melts out during the heat treatment and this is not preferred.

Incidentally, from the standpoint of the apparatus life as the RTP apparatus, the upper limit of the maximum achievable temperature is preferably 1,380° C. or less.

If the temperature drop rate is less than 50° C./sec, the BMD density in the wafer bulk part can be hardly raised to a level of $1.0 \times 10^{10}$ cm$^{-3}$.

On the other hand, if the temperature drop rate exceeds 145° C./sec, the BMD density inside of the wafer may be raised, but generation of a slip in the wafer during RTP is difficult to suppress and this is not preferred.

The temperature drop rate is more preferably from 50 to 70° C./sec or from 90° C./sec to 145° C./sec.

By controlling the temperature drop rate to the range above, BMD can be formed at a high density in the bulk part while greatly suppressing generation of a slip during RTP.

In particular, when the temperature drop rate is set to a range from 90° C./sec to 145° C./sec, the BMD density in the bulk part can be raised to about $3.0 \times 10^{10}$ cm$^3$.

In the oxygen-containing atmosphere, the oxygen partial pressure is preferably set to a range from 20% to 100%.

If the oxygen partial pressure is less than 20%, the concentration of interstitial silicon that fills COP decreases and in turn, the ability of eliminating COP in the wafer surface part is disadvantageously reduced.

The gas other than oxygen gas in the oxygen-containing atmosphere is preferably an inert gas.

In the case of using a nitrogen gas as the gas other than oxygen gas, a nitride film is formed on the wafer surface in RTP, and an etching step or the like for removing the nitride film must be newly added, which is not preferred because of increase in the number of steps. Also, the hydrogen gas is not preferred because a mixed gas of oxygen and hydrogen has a danger of explosion. Furthermore, an ammonia-based gas reduces the ability of eliminating the crystal defects such as COP and is not preferred.

As for the inert gas, use of an argon gas is preferred. The argon gas enables performing the RTP without involving formation of other film such as nitride film or causing a chemical reaction or the like.

On the other hand, the second atmosphere gas $F_B$ supplied to the second space 320b on the back W2 side of the wafer W is preferably helium having a large thermal conductivity.

By using such a gas having a high cooling effect, the temperature drop rate can be easily increased and this contributes to formation of high-density BMD.

The temperature rise rate in the heat treatment sequence of RTP is preferably from 10° C./sec to 150° C./sec.

If the temperature rise rate is less than 10° C./sec, the productivity decreases and this is not preferred.

On the other hand, if the temperature rise rate exceeds 150° C./sec, the wafer cannot withstand the excessively rapid temperature change and may allow generation of a slip.

The holding time t for which the maximum achievable temperature is held is preferably from 1 to 60 seconds.

If the holding time t is less than 1 second, it is difficult to attain the intended purpose of RTP, such as reduction of crystal defects or increase of the MBD density.

On the other hand, if the holding time t exceeds 60 seconds, the productivity decreases and this is not preferred.

In the present invention, the wafer subjected to RTP is, as described above, a wafer obtained by slicing a silicon single crystal ingot produced by a CZ method but is preferably a wafer obtained by slicing the silicon single crystal ingot from a region where a vacancy-type point defect is predominantly present.

The defect region in the silicon single crystal ingot is described below by referring to FIG. 20.

Figure 20:
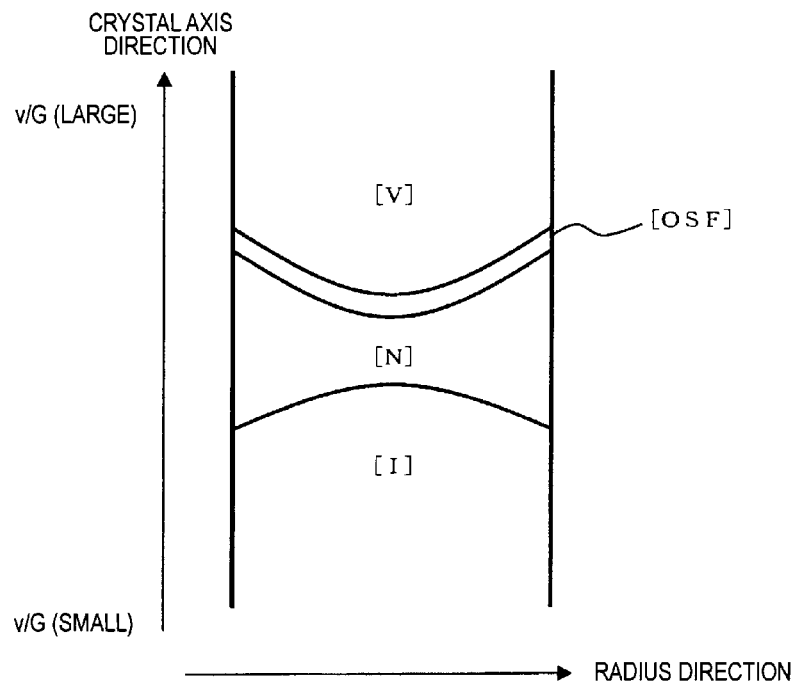
FIG. 20 is a view schematically showing the relationship between V/G and the crystal defect generation position at the production of a silicon single crystal ingot in the fourth embodiment.

FIG. 20 is a cross-sectional view of an ingot, schematically showing the relationship between v/G and the crystal defect generation position at the production of a silicon single crystal ingot, where v indicates the pulling rate and G indicates the temperature gradient G in the pulling axis direction within the single crystal. Also, "V" is a region where a vacancy-type point defect is predominantly present (hereinafter referred to as a "V" region), [I] is a region where an interstitial silicon-type point defect is predominantly present (hereinafter referred to as a "I" region), [N] is a region where an aggregate of interstitial silicon-type point defects and an aggregate of vacancy-type point defects are not present (hereinafter referred to as an "N" region), and "OSF" is a region which belongs to the "V" region and in which Oxidation-induced Stacking Fault (OSF) is produced when the silicon single crystal ingot is subjected to heat oxidation treatment in the state of a silicon wafer (hereinafter referred to as an "OSF" region).

The wafer subjected to the heat treatment in the fourth embodiment is preferably a wafer sliced, in FIG. 20, from a region where a vacancy-type point defect is predominantly present, that is, from a position containing only the "V" region or only the "OSF" region and the "V" region.

In the wafer sliced from the "N" region, vacancies necessary for a BMD nucleus to grow in the bulk part are not present and therefore, elevation of the BMD density is limited. Also, as well known, a wafer sliced from the "I" region can not be used as a substrate for the formation of a semiconductor device.

As long as the wafer is a wafer sliced from a position containing only the "V" region or only the "OSF" region and the "V" region, the growth of a silicon single crystal ingot by a CZ method can be performed at a large v/G, that is, a high pulling rate v, so that the productivity can be raised and the cost of ingot growth can be reduced. Furthermore, many vacancies necessary for the growth of BMD nuclei are formed in the bulk part, so that BMD can be formed at a high density in RTP later.

More preferably, a wafer sliced such that the entire wafer is composed of only the "V" region not containing the "OSF" region, is used. When the wafer is a wafer not containing the "OSF" region, in addition to the above-described effects, the BMD density can be made uniform in the wafer plane.

EXAMPLE 4

The fourth embodiment is described in greater detail below by referring to Example 4, but the fourth embodiment is not limited to the following Example 4.
(Test 1) Relationship Among Temperature Drop Rate, BMD Density and Total Slip Length:

A silicon single crystal ingot having a region where a vacancy-type point defect is predominantly present was produced by a CZ method while controlling v/G, and a silicon wafer (diameter: 300 mm, thickness: 775 μm) sliced from the region and mirror-polished on both surfaces was subjected to RTP in a 100% oxygen (flow rate: 20 slm) atmosphere under the conditions of a temperature T0: 600° C., a temperature rise rate: 70° C./sec, a maximum achievable temperature: 1,350° C. and a holding time at the maximum achievable temperature: 15 seconds by varying the temperature drop rate as shown in Table 1.

Incidentally, in the case where the temperature drop rate was 120° C./sec or more (Examples 4-4 and 4-5 and Comparative Examples 4-3 and 4-4), in order to increase the wafer cooling rate, a helium gas having a large thermal conductivity was introduced into the wafer back side.

The resultant annealed wafer was subjected to a BMD precipitation heat treatment (780° C.×3 hours+1,000° C.×16 hours) and then, the BMD density in the wafer surface layer part to a depth of 180 μm from the surface was measured by an IR tomography (MO-411, manufactured by Raytex Corporation).

Also, the annealed wafer obtained above was measured for the total slip length by an X-ray topography (XRT300, manufactured by Rigaku Corporation).

Figure 21:
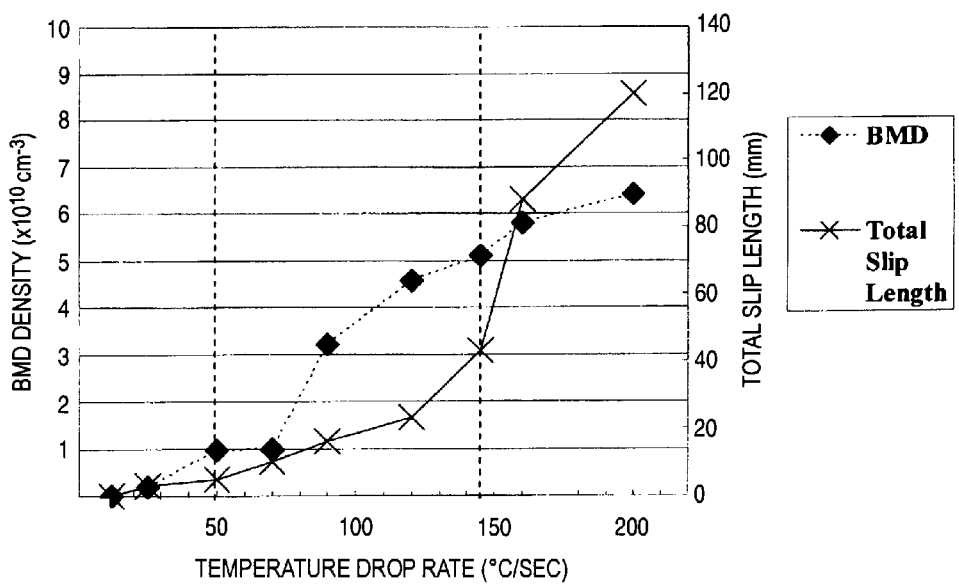
FIG. 21 is a graph showing the relationship among the temperature drop rate, the BMD density and the total slip length in Test 1 of the fourth embodiment.

The measurement results of BMD density and total slip length at each temperature drop rate are shown in Table 3. FIG. 21 is a graph showing the relationship among the temperature drop rate, the BMD density and the total slip length based on the results in Table 3.

Figure 22:
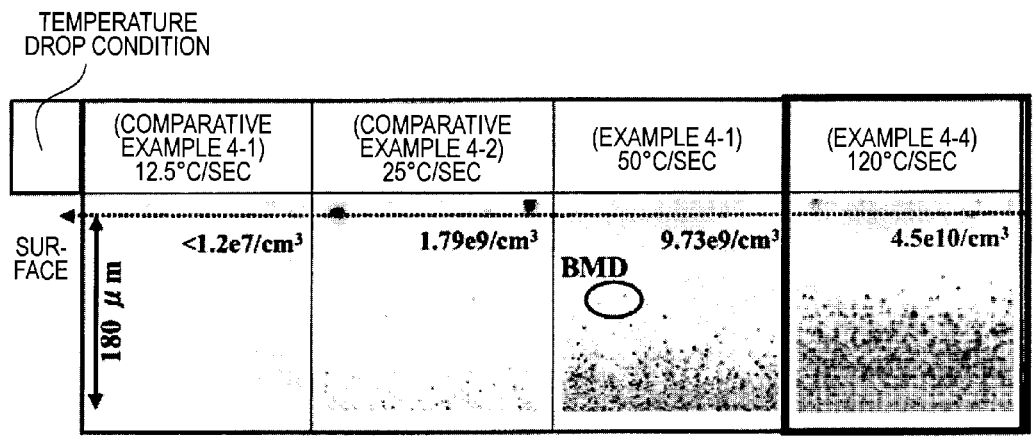
FIG. 22 is an IR tomography image at a predetermined temperature drop rate in Test 1.

FIG. 22 is an IR tomography image at a predetermined temperature drop rate.

TABLE 3

|  | Temperature Drop Rate (° C./sec) | BMD Density (cm$^{-3}$) | Total Slip Length (mm) |
| --- | --- | --- | --- |
| Comparative Example 4-1 | 12.5 | <1.2 × 10$^7$ | could not be confirmed |
| Comparative Example 4-2 | 25 | 1.79 × 10$^9$ | 3 |
| Example 4-1 | 50 | 9.73 × 10$^9$ | 5 |
| Example 4-2 | 70 | 1.0 × 10$^{10}$ | 10 |
| Example 4-3 | 90 | 3.2 × 10$^{10}$ | 16 |
| Example 4-4 | 120 | 4.5 × 10$^{10}$ | 23 |
| Example 4-5 | 145 | 5.1 × 10$^{10}$ | 43 |
| Comparative Example 4-3 | 160 | 5.8 × 10$^{10}$ | 88 |
| Comparative Example 4-4 | 200 | 6.4 × 10$^{10}$ | 120 |

As seen from the results shown in Table 3 and the graph of FIG. 21, there was a tendency that as the temperature drop rate in RTP is increased, the BMD density of wafer is increased and at the same time, the slip length due to thermal stress is increased.

Also, as seen from the IR tomography image of FIG. 22, there was a tendency that when the temperature drop rate is increased, the region where BMD is present comes close to the wafer surface side and at the same time, the BMD density in the wafer bulk part is increased.

From these results, it is recognized that when the temperature drop rate is from 50° C./sec to 145° C./sec, BMD can be grown at a high density in the bulk part while suppressing slip generation during RTP to an allowable range; in particular, that when the temperature drop rate is from 50° C./sec to 70° C./sec, the slip generation can be suppressed to the minimum while forming BMD at a high density, and when the temperature drop rate is from 90° C. to 145° C., BMD can be grown at a higher density while suppressing the slip generation during RTP to an allowable range.
(Test 2) Relationship of Temperature Drop Rate and Oxygen Concentration of Wafer:

A silicon single crystal ingot having a region where a vacancy-type point defect is predominantly present was produced by a CZ method while controlling v/G, and a wafer (diameter: 300 mm, thickness: 775 μm) sliced from the region and mirror-polished on both surfaces was subjected to a heat treatment at 1,200° C. for 1 hour in an Ar atmosphere by using a vertical diffusion furnace, thereby out-diffusing oxygen from the wafer surface layer.

Thereafter, RTP was performed in a 100% oxygen (flow rate: 20 slm) atmosphere under the conditions of a temperature T0: 600° C., a temperature rise rate: 70° C./sec, a maximum achievable temperature: 1,350° C. and a holding time at the maximum achievable temperature: 15 seconds by varying the temperature drop rate (Comparative Example 4-5: 12.5° C./sec, Comparative Example 4-6: 25° C./sec, Example 4-6: 50° C./sec, Example 4-7: 120° C./sec).

The oxygen concentration profile in the depth direction at the wafer center of each of the resultant annealed wafers was evaluated by a secondary ion mass spectrometer (SIMS; Ims-6f, manufactured by Cameca).

Figure 23:
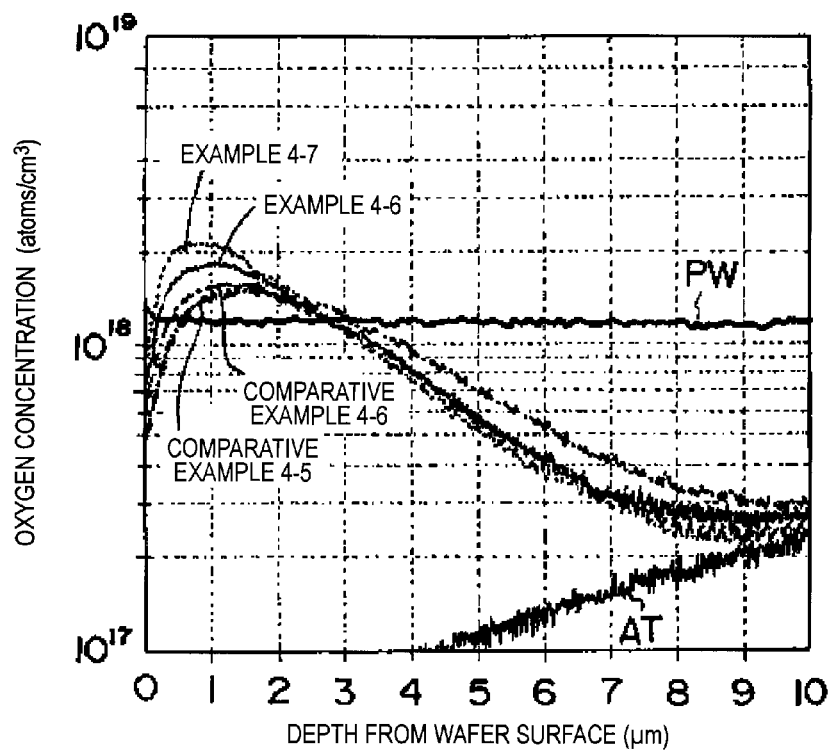
FIG. 23 is a graph showing an oxygen concentration profile in the depth direction at the center of the wafer at each temperature drop rate in Test 2 of the fourth embodiment.

FIG. 23 is a graph showing the evaluation results. The oxygen concentration is a value by old-ASTM conversion. In FIG. 23, "AT" is a wafer after only the heat treatment in a vertical diffusion furnace was performed without conducting RTP above, and "PW" is a mirror-polished wafer before the heat treatment in a vertical diffusion furnace.

As seen from the graph of FIG. 23, when the temperature drop rate is increased, the temperature drop time is shortened, whereby out-diffusion of oxygen is suppressed and a wafer having a higher concentration of solid-solution oxygen in the surface part than PW is obtained. In particular, it is recognized that when the temperature drop rate is 50° C./sec or more (Examples 4-6 and 4-7), the oxygen concentration in the wafer surface part is markedly increased than in the case of less than 50° C./sec (Comparative Examples 4-5 and 4-6).

(Test 3) Comparison of Atmosphere and Maximum Achievable Temperature:

A silicon single crystal ingot having a region where a vacancy-type point defect is predominantly present was produced by a CZ method while controlling v/G, and a wafer (diameter: 300 mm, thickness: 775 μm) sliced from the region and mirror-polished on both surfaces was subjected to RTP under the conditions of a temperature T0: 600° C., a temperature rise rate: 70° C./sec, a holding time at the maximum achievable temperature: 30 seconds and a temperature drop rate: 120° C./sec by varying the oxygen partial pressure, gas species or maximum achievable temperature in the heat treatment atmosphere.

The resultant annealed wafers were evaluated for the percentage decrease of LSTD between before and after RTP in the wafer surface part to a depth of 5 μm from the surface where a semiconductor device is formed, by an LSTD scanner (MO-601, manufactured by Raytex Corporation). The evaluation results are shown in Table 4.

TABLE 4

| | Atmosphere | Maximum Achievable Temperature (° C.) | Holding Time (sec.) | Percentage Decrease of LSTD (%) |
|---|---|---|---|---|
| Example 4-8 | 100% oxygen | 1300 | 30 | 68 |
| Comparative Example 4-7 | 100% oxygen | 1275 | 30 | 30 |
| Comparative Example 4-8 | 15% oxygen + argon | 1300 | 30 | 38 |
| Example 4-9 | 20% oxygen + argon | 1300 | 30 | 60 |
| Comparative Example 4-9 | ammonia | 1300 | 30 | 8 |

As seen from Table 4, in the case of 100% oxygen atmosphere and a maximum achievable temperature of 1,300° C. (Example 4-8), LSTD can be eliminated by nearly 70%. Also, it is recognized that when the partial pressure is 20% or more (Example 4-9), LSTD can be eliminated by 60%.

On the other hand, in the case of a maximum achievable temperature (° C.) of less than 1,300° C. (Comparative Example 4-7), an oxygen partial pressure of 15% (Comparative Example 4-8) or an ammonia atmosphere (Comparative Example 4-9), the percentage disappearance of LSTD is found to be small.

While the present inventive concept has been shown and described with reference to certain exemplary embodiments thereof, it will be understood by those skilled in the art that various changes in form and details may be made therein without departing from the spirit and scope of the invention as defined by the appended claims.

What is claimed is:

1. A method for manufacturing a silicon wafer comprising:
   subjecting a silicon wafer produced from a silicon single crystal ingot grown by a Czochralski process to a rapid heating/cooling thermal process of retaining the silicon wafer for 1 second to 60 seconds at a maximum temperature of 1300° C. to 1380° C. in an oxidizing gas atmosphere having an oxygen partial pressure of 20% to 100%,
   wherein
   in the rapid heating/cooling thermal process, a temperature raise rate is 10° C./sec or more and a temperature drop rate is 10° C./sec or more; and
   the silicon single crystal ingot is grown by the Czochralski process pulling
      at a rate of 1.2 mm/min or more on average when a silicon wafer having a diameter of 300 mm is produced, and
      at a rate of 1.8 mm/min or more on average when a silicon wafer having a diameter of 200 mm is produced.

2. The method for manufacturing the silicon wafer according to claim 1, wherein
   the maximum temperature is set at a range 1350° C. to 1380° C.

3. The method for manufacturing the silicon wafer according to claim 1, wherein
   a variation in thickness, within a wafer plane, of a silicon oxide film formed by the rapid heating/cooling thermal process is within 1.5% in terms of a ratio calculated from $(t_{ox}max - t_{ox}min)/(t_{ox}ave)$ wherein $t_{ox}max$ represents a maximum film thickness, $t_{ox}min$ represents a minimum film thickness, and $t_{ox}ave$ represents an average film thickness.

4. The method for manufacturing the silicon wafer according to claim 1, wherein
   an agglomerate of supersaturated vacancy-type point defects in at least a device active region of the silicon wafer before the rapid heating/cooling thermal process has a size, at a maximum, of 180 nm or less in terms of a diameter of a sphere having an equal volume to that of the agglomerate.

5. The method for manufacturing the silicon wafer according to claim 1, wherein the silicon single crystal ingot is grown by nitrogen-free doping.

6. The method for manufacturing the silicon wafer according to claim 1, wherein
   a concentration of an oxygen solid solution in the silicon single crystal ingot falls within a range from $5 \times 10^{17}$ atoms/cm$^3$ to $1.3 \times 10^{18}$ atoms/cm$^3$.

7. The method for manufacturing the silicon wafer according to claim 1, further comprising:
   polishing the surface of the silicon wafer after the rapid heating/cooling thermal process.

8. The method for manufacturing the silicon wafer according to claim 1, wherein
   the rapid heating/cooling thermal process is applied to the silicon wafer to eliminate, from at least a device active region of the silicon wafer, an agglomerate of supersaturated vacancy-type point defects and an oxygen precipitate to form a DZ layer, and an oxygen solid solution is introduced into the DZ layer.

9. A method for heat-treating a silicon wafer, comprising:
when a wafer sliced from a silicon single crystal ingot produced by a Czochralski method is subjected to a rapid heating/cooling thermal process,
setting both of a temperature rise rate and a temperature drop rate to a range from 10° C./sec to 150° C./sec;
setting a maximum achievable temperature to a range from 1300° C. to a melting point of silicon;
setting a holding time at the maximum achievable temperature to a range from 1 second to 60 seconds;
setting an atmosphere in a holding state at said maximum achievable temperature to an oxidizing gas atmosphere having an oxygen partial pressure of 20% to 100% on a surface side of said wafer; and
setting an atmosphere on a back side of said wafer to an inert gas atmosphere,
wherein the atmosphere on the surface side is set to the inert gas atmosphere in the temperature rise process, and after reaching the maximum achievable temperature, the atmosphere on the surface side is switched to an oxidizing gas atmosphere having an oxygen partial pressure of 20% to 100%, and
wherein in the temperature drop process, both the surface side and the back side of said wafer are set to the inert gas atmosphere.

10. The method according to claim 9, wherein the flow rate of an oxidizing gas supplied to create an oxidizing gas atmosphere on the surface side of said wafer is smaller than the flow rate of an inert gas supplied to create the inert gas atmosphere on the back side of said wafer.

* * * * *